United States Patent
Ahmad et al.

(10) Patent No.: US 10,692,862 B2
(45) Date of Patent: Jun. 23, 2020

(54) ASYMMETRIC VARACTOR

(71) Applicant: Board of Regents, The University of Texas System, Austin, TX (US)

(72) Inventors: Zeshan Ahmad, Richardson, TX (US); Kenneth K. O, Richardson, TX (US)

(*) Notice: Subject to any disclaimer, the term of this patent is extended or adjusted under 35 U.S.C. 154(b) by 0 days.

(21) Appl. No.: 15/881,534

(22) Filed: Jan. 26, 2018

(65) Prior Publication Data
US 2018/0211954 A1 Jul. 26, 2018

Related U.S. Application Data

(60) Provisional application No. 62/450,907, filed on Jan. 26, 2017.

(51) Int. Cl.
| | | |
|---|---|---|
| H01L 29/93 | (2006.01) | |
| H01L 27/08 | (2006.01) | |
| H03K 5/00 | (2006.01) | |

(52) U.S. Cl.
CPC .......... H01L 27/0808 (2013.01); H01L 29/93 (2013.01); H03K 5/00006 (2013.01)

(58) Field of Classification Search
CPC .. H01L 27/0808; H01L 29/93; H03K 5/00006
See application file for complete search history.

(56) References Cited

U.S. PATENT DOCUMENTS 7,612,629 B2 * 11/2009 Pepper ................... H03B 19/05
327/106

OTHER PUBLICATIONS

Ahmad et al., 1.4THz, −13dBm-EIRP Frequency Multiplier Chain Using Symmetric- and Asymmetric-CV Varactors in 65nm CMOS, Feb. 3, 2016, IEEE ISSC, Session 20, pp. 350-352 (Year: 2016).*
A. Maestrini et al., "Design and Characterization of a Room Temperature All-Solid-State Electronic Source Tunable From 2.48 to 2.75THz", IEEE T. THz Sc. & Tech., v 2, n. 2, pp. 177-185, Mar. 2012.
B. Diamond, "Idler circuits in varactor frequency multipliers," IEEE T. Circ. Th., 1963.
C. Mao, et al., "125-GHz diode frequency doubler in 0.13-μm CMOS," IEEE JSSC, vol. 44, No. 5, pp. 1531-1538, 2009.
D. Shim, et al., "Components for generating and phase locking 390-GHz signal in 45-nm CMOS," IEEE VLSI Symp., 2012.
D. Shim, et al., "Symmetric Varactor in 130nm CMOS for Frequency Multiplier Applications," IEEE EDL, vol. 32, No. 4, 470-472, Mar. 2011.
E. Ojefors et al., "A 820GHz SiGe chipset for terahertz active imaging applications," ISSCC, pp. 224-225, Feb. 2011.

(Continued)

*Primary Examiner* — Jung Kim

(57) ABSTRACT

An accumulation-mode MOS varactor is formed with a standard CMOS process and having an anti-symmetric-CV curve. The asymmetric varactor (ASVAR) can efficiently generate even-order harmonics while simultaneously suppressing odd-order harmonics over broad bandwidths. This is achieved without degradation of dynamic cut-off frequency. The improved cut-off frequency of the asymmetric varactor results in efficient even-harmonic generation well into sub-millimeter or terahertz frequencies. This and the inherent adaptive-CV features of the asymmetric varactor result in even-harmonic generation with process variation resilience and can also be utilized for frequency response shaping and for optimizing performance at various driving conditions.

13 Claims, 20 Drawing Sheets

ASVAR SCHEMATIC

(56) References Cited

OTHER PUBLICATIONS

E. Öjefors, et al., "Active 220- and 325-GHz frequency multiplier chains in an SiGe HBT technology," IEEE MTT, vol. 69, No. 5, 2011.

E. Seok, et al., "Progress and challenges towards terahertz CMOS integrated circuits," IEEE JSSC, vol. 45, No. 8, pp. 1554-1564, 2010.

F. Golcuk, et al., "A 0.37-0.43THz wideband quadrupler with 160µW peak output power in 45nm CMOS," IEEE MTT-S, 2013.

K. Statnikov et al., "160GHz to 1THz multi-color active imaging with a lens-coupled SiGe HBT chip-set," IEEE T-MTT, v. 63, n. 2, pp. 520-532, Feb. 2015.

O. Momeni, et al., "High power terahertz and submillimeter wave oscillator design: a systematic approach," IEEE JSSC, vol. 46, No. 3, pp. 583-597, 2011.

P. Penfield and R. Rafuse, Varactor Applications. Cambridge, MA, USA: MIT Press, pp. 83-88, 1962.

R. Han, et al., "A broadband 480-GHz passive frequency doubler in 65-nm bulk CMOS with 0.23mW output power," IEEE RFIC Symp., 2012.

U. Pfeiffer et al, "A 0.53THz Reconfigurable Source Array with up to 1mW Radiated Power for THz Imaging Apps. in 0.13µm SiGe BiCMOS," ISSCC, pp. 256-257, Feb. 2014.

W. Avellino, "Efficient odd harmonic generation with opposingly biased varactor diodes," Proc. of IEEE, vol. 52, No. 7, pp. 868-869, 1964.

Z. Ahmad et al., "0.39-0.45THz symmetric MOS-varactor frequency tripler in 65nm CMOS," IEEE RFIC Symp., pp. 275-278, May 2015.

Z. Ahmad et al., "0.65-0.73THz Quintupler with an On-Chip Antenna in 65nm CMOS," IEEE Symp. on VLSI Circs., pp. 310-311, Jun. 2015.

Z. Ahmad, et al., "9.74-THz Electronic Far-Infrared Detection Using Schottky Barrier Diodes in CMOS," IEEE IEDM, 2014.

\* cited by examiner

ASVAR 3D CROSS-SECTION

ASVAR SCHEMATIC

SVAR 3D CROSS-SECTION

SVAR SCHEMATIC

ASYMMETRIC VARACTOR

CROSS REFERENCE TO RELATED APPLICATIONS

This application claims priority to U.S. Provisional Application No. 62/450,907 filed Jan. 26, 2017, which is incorporated herein by reference in its entirety.

TECHNICAL FIELD OF THE INVENTION

This disclosure relates generally to the methods and techniques for varactors. In particular, this invention details novel methods and apparatus for asymmetric varactors.

BACKGROUND

Complementary metal-oxide-semiconductor (CMOS) is a technology for constructing integrated circuits via semiconductors. CMOS technology is used to fabricate microprocessors, microcontrollers, static random access memory (RAM), and other digital logic circuits. CMOS technology is also used for several analog circuits such as image sensors (CMOS sensor), data converters, and highly integrated transceivers for many types of communication applications. The word "complementary" refers to the fact that the typical design style with CMOS uses complementary and symmetrical pairs of p-type and n-type metal oxide semiconductor field effect transistors (MOSFETs) for logic functions. The phrase "metal-oxide-semiconductor" is a reference to the physical structure of certain field-effect transistors, having a metal (or doped polycrystalline silicon) gate electrode placed on top of an oxide insulator (e.g., silicon dioxide), which in turn is on top of an n-type or a p-type semiconductor material.

CMOS technology in the past decade has made great progress in reaching the terahertz (THz) threshold. Significant advancements have been made on the reception front with passive detection reaching 10 THz. Efficient and broadband signal generation beyond 300 gigahertz (GHz) in a compact form factor, however, remains a challenge due to limited transit-time and device parasitics that lead to high frequency performance roll-off and place limits on maximum operating frequencies.

Oscillators incorporating a frequency multiplication function allow for frequencies above traditional maximum frequencies of a device. The major drawback of such circuits is low realized bandwidths at high frequencies making them unattractive for many applications. Another technique is harmonic multiplication through nonlinear mixing using an input driving signal at relatively low frequencies. Active multipliers, although promising, consume direct current (DC) power and suffer from excessive resistive loss above maximum oscillation frequency of the device ($f_{max}$) leading to poor efficiency. Accumulation-mode MOS (A-MOS) and Schottky-barrier diode (SBD) varactors have been used previously to implement passive frequency-doublers with output frequency at 125 GHz and 480 GHz, respectively with acceptable efficiency and output power ($P_{OUT}$). While promising, these passive doublers suffer from multiple limitations, including: 1) low-order multiplication requires a high power amplifier (>10 decibel milliwatts (dBm)) near technology $f_{max}$ to drive the circuit, which is either non-realizable or extremely inefficient in area and power; 2) higher-order multiplication using predominantly square-law A-MOS varactors necessitates idlers for secondary mixing leading to poor conversion loss (CL) performance—due to loss in passive-idlers and due to the indirect nature of mixing—and introducing bandwidth reductions on the system since the idlers are tuned elements; and 3) unavoidable harmonics are suppressed by use of on-chip baluns and symmetric-ring combining structures leading to bandwidth limitation and loss.

SUMMARY OF THE DISCLOSURE

According to a preferred embodiment, a frequency multiplier is provided that comprises an asymmetric varactor having an asymmetric capacitance-voltage (CV) curve with adaptive control that provides for efficient generation of even order harmonics of an input signal about an order of magnitude above the maximum operating frequency of the technology ($f_{max}$).

According to another preferred embodiment, a frequency multiplier is provided that comprises a symmetric varactor and an asymmetric varactor. The symmetric varactor provides for efficient generation of odd-order harmonics and the asymmetric varactor provides for efficient generation of even-order harmonics.

According to another preferred embodiment, method of a frequency multiplier is provided that receives a first bias-signal, a second bias-signal, and an input signal. In response to the first bias-signal, the second bias-signal, and the input signal, an asymmetric varactor of the frequency multiplier generates even order harmonics.

According to another preferred embodiment, method of a frequency multiplier with multiple stages is provided that receives a first bias-signal of a first stage, a second bias-signal of the first stage, and an input signal of the first stage. In response to the first bias-signal, the second bias-signal, and the input signal at the first stage, a symmetric varactor of the frequency multiplier generates odd-order harmonics. A second stage of the frequency multiplier receives a first bias-signal of the second stage, a second bias-signal of the second stage, and the output signal from the first stage. In response to the first bias-signal of the second stage, the second bias signal of the second stage, and the output signal from the first stage, the second stage of the frequency multiplier generates even order harmonics.

DETAILED DESCRIPTION

While the making and using of various embodiments of the present disclosure are discussed in detail below, it should be appreciated that the present disclosure provides many applicable inventive concepts that can be embodied in a wide variety of specific contexts. The specific embodiments discussed herein are merely illustrative of specific ways to make and use the invention and do not limit the scope of the invention.

Figure 1:
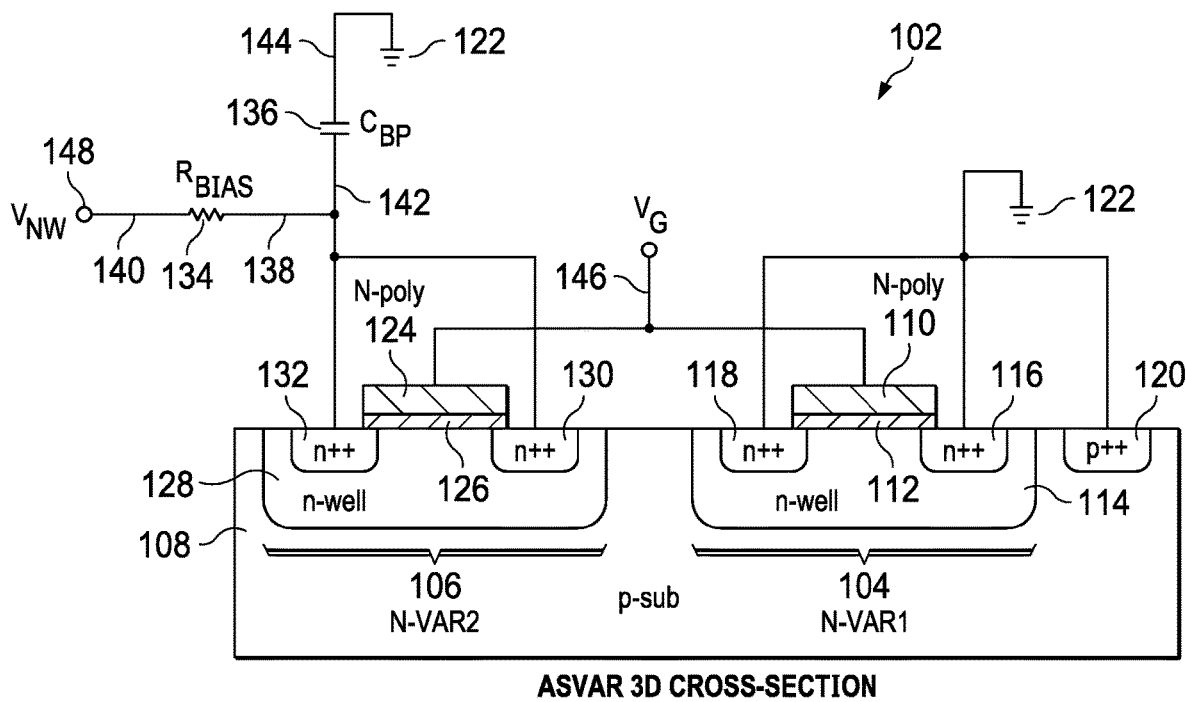
FIG. 1 is a combination view that shows the three dimensional cross-section of an asymmetric varactor (AS-VAR) along with a schematic of electrical connections in accordance with the disclosure.

FIG. 1 is a combination view that shows the three dimensional cross section of an asymmetric varactor (AS-VAR) along with a schematic of electrical connections in accordance with the disclosure. Asymmetric varactor 102 includes first n-type varactor (N-VAR1) 104 and second n-type varactor (N-VAR2) 106 formed in and on p-type substrate (p-sub) 108. Asymmetric varactor 102 is an asymmetric capacitance-voltage (CV) A-MOS varactor (ASVAR) that can be realized in any silicon process without modifications to the flow. Asymmetric varactor 102 has a symmetric voltage-current (V-I) relation with an anti-symmetric CV curve with stronger large-signal non-linearity owing to four-knee regions that enhances even order harmonics while suppressing odd order harmonic generation, which leads to efficient even-order frequency multiplication. This is achieved without degradation of the dynamic cutoff frequency ($f_{cd}$) so that asymmetric varactor 102 can output frequency multiples that reach into and above terahertz (THz) operating frequencies in standard silicon processes, unlike other technologies. Asymmetric varactor 102 is different from a symmetric varactor in that the doping type of the material used to form first n-type varactor 104 is not the opposite or complement of the doping type of the material used to form second n-type varactor 106.

First n-type varactor 104 includes n-type polycrystalline silicon (n-poly) 110, gate oxide 112 (silicon dioxide), n-type well (n-well) 114, first heavily doped n-type area (n++ area) 116, second n++ area 118, p-type substrate tap that is a heavily doped p-type area (p++ area) 120. First n-type varactor 104 is a metal oxide semiconductor (MOS) device, which traditionally has three layers: a metal layer, an oxide layer, and a semiconductor layer. For first n-type varactor 104, n-poly 110 acts as the metal layer of first n-type varactor 104, gate oxide 112 acts as the oxide layer of first n-type varactor 104, and n-well 114 acts as the semiconductor layer of first n-type varactor 104. Additionally, n-poly 110 can be referred to as the "top plate" of first n-type varactor 104 and n-well 114 can be referred to as the "bottom plate" of first n-type varactor 104.

First n++ area 116, second n++ area 118, and p++ area 120 are heavily doped regions that are electrically connected to ground 122.

Second n-type varactor 106 includes n-type polycrystalline silicon (n-poly) 124, gate oxide 126 (silicon dioxide), n-type well (n-well) 128, first heavily doped n-type area (n++ area) 130, second n++ area 132. Second n-type varactor 106 is also a metal oxide semiconductor (MOS) device. N-poly 124 acts as the metal layer of second n-type varactor 106, gate oxide 126 acts as the oxide layer of second n-type varactor 106, and n-well 128 acts as the semiconductor layer of second n-type varactor 106.

First n++ area 130 and second n++ area 132 are heavily doped regions that are electrically connected to resistor 134 and capacitor 136.

Figure 13:
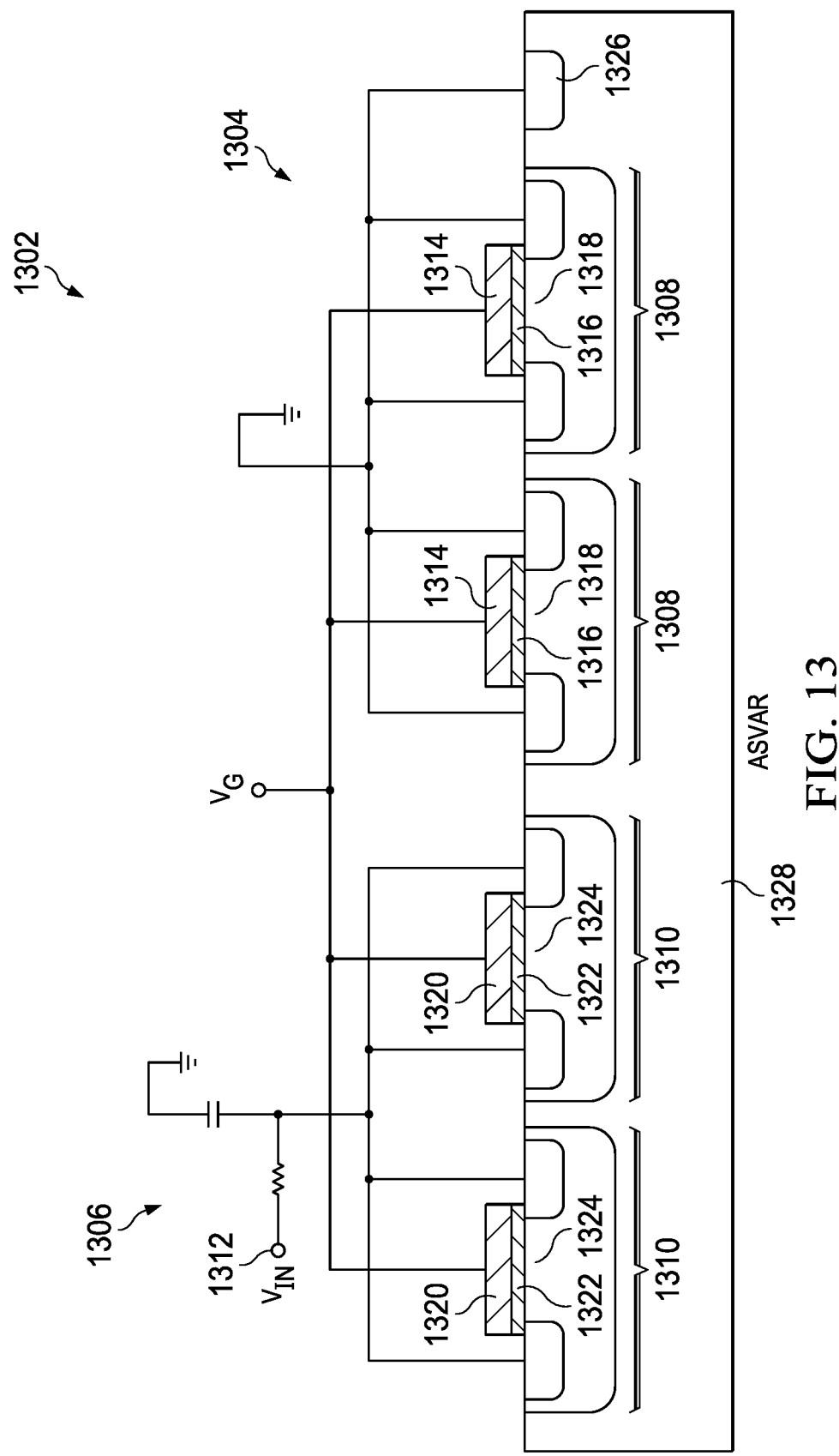
FIG. 13 is a combination view of an asymmetric varactor with multiple fingers.

First n-type varactor 104 and second n-type varactor 106 are each formed as having a single finger. Additional or alternative embodiments may have one or more additional fingers that are connected in parallel for either or both of first n-type varactor 104 and second n-type varactor 106. FIG. 13, discussed below, shows one embodiment of an asymmetric varactor with multiple fingers for each varactor that form the asymmetric varactor. Each finger of a varactor comprises a copy of the semiconductor regions of the varactor and each finger is electrically connected in parallel. Using multiple fingers allows for larger powers, voltages, and currents to be used with an asymmetric varactor.

For resistor 134, first terminal 138 is connected to first n++ area 130, second n++ area 132, and capacitor 136. Second terminal 140 of resistor 134 is connected to second terminal 148, which provides the input for the n-well voltage $V_{NW}$.

For capacitor 136, a first terminal 142 is connected to first n++ area 116, second n++ area 118, and resistor 134. Second terminal 144 of capacitor 136 is connected to ground 122.

$V_G$ is the top plate bias voltage, also referred to as a first bias signal, which is applied to first terminal 146. First terminal 146 is electrically connected to n-poly 110 and 124 of varactors 104 and 106 so as to commonly connect each of the metal layers of varactors 104 and 106.

The semiconductor layers of varactors 104 and 106 are not commonly connected so that the semiconductor layer of first n-type varactor 104 (i.e., n-well 114) can be grounded while the semiconductor layer of second n-type varactor 106 (i.e., n-well 128) can be biased by $V_{NW}$ to create an asymmetric capacitance-voltage (CV) curve for asymmetric varactor 102. $V_{NW}$ is the well bias voltage, also referred to as a second bias signal, which is applied to second terminal 148 that is substantially a direct current (DC) voltage. $V_{NW}$ controls the bias of n-well 128 to affect the capacitance-voltage (CV) characteristics of second n-type varactor 106 and asymmetric varactor 102.

Parallel connection of two n-type varactors (N-VARs) 104 and 106 creates asymmetric varactor 102. Biasing n-well 128 of second n-type varactor 106 while keeping n-well 114 of first n-type varactor 104 grounded results in an anti-symmetric CV curve. The enhanced anti-symmetry in the CV curve of asymmetric varactor 102 enhances the generation of even-order harmonics while suppressing the generation of odd-order harmonics. Utilization of asymmetric varactors creates a pathway for efficient even-order frequency multiplication in much the same way that anti-parallel diode pairs (ADPD) and symmetric varactors created a pathway for efficient odd-order frequency multiplication. Unlike using ADPD and A-MOS varactors, asymmetric varactor 102 does not have the limitations on bandwidth and efficiency imposed by the resistive multiplication nature of ADPD or imposed by symmetric combining structures required for A-MOS varactors. The tuning-ratio of related to varactors 104 and 106 within the asymmetric varactor 102 is not affected by connection in this way, so that the resulting dynamic cut-off frequency for asymmetric varactor 102 is equal to or better than equivalent ADPDs or A-MOS varactors, depending on n-well bias ($V_{NW}$).

The different layers and structures of asymmetric varactor 102 are formed by one or more of growing, masking, etching, implanting, depositing, and so on, as related to semiconductor device fabrication. Different materials, elements and compounds may be used in different embodiments. In one alternative embodiment, the doping type is reversed to have an asymmetric varactor formed on an n-type substrate with parallel connected p-type varactors.

Figure 2:
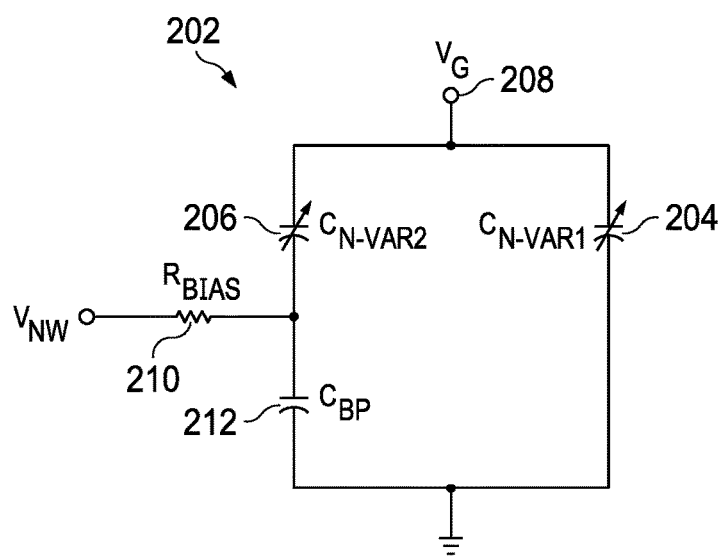
FIG. 2 is an electrical schematic of an asymmetric varactor in accordance with the disclosure.

FIG. 2 is an electrical schematic of an asymmetric varactor in accordance with the disclosure. Asymmetric varactor 202 is an embodiment of an asymmetric varactor, such as asymmetric varactor 102 of FIG. 1. Asymmetric varactor 202 includes first varactor 204 and second varactor 206 that are of the same doping type. First and second varactors 204 and 206 are shown with the electrical symbols for variable capacitors and labeled as $C_{N-VAR1}$ and $C_{N-VAR2}$.

$V_G$ is the top plate bias voltage and is applied to first terminal 208. Asymmetric varactor 202 outputs a signal that includes an even order harmonic of the frequency of the input signal.

$V_{NW}$ is the voltage applied to asymmetric varactor 202 to control the bias of an n-well of second varactor 206 to change the response characteristics of second varactor 206 and of asymmetric varactor 202.

Resistor 210 (labeled as $R_{BIAS}$) biases the n-well of the second varactor 206 allowing the CV curve of second varactor 206 and asymmetric varactor 202 to be changed and tuned.

Capacitor 212 (labeled as $C_{BP}$) is a bypass capacitor and substantially removes the alternating current (AC) component or noise from $V_{NW}$.

Figure 3:
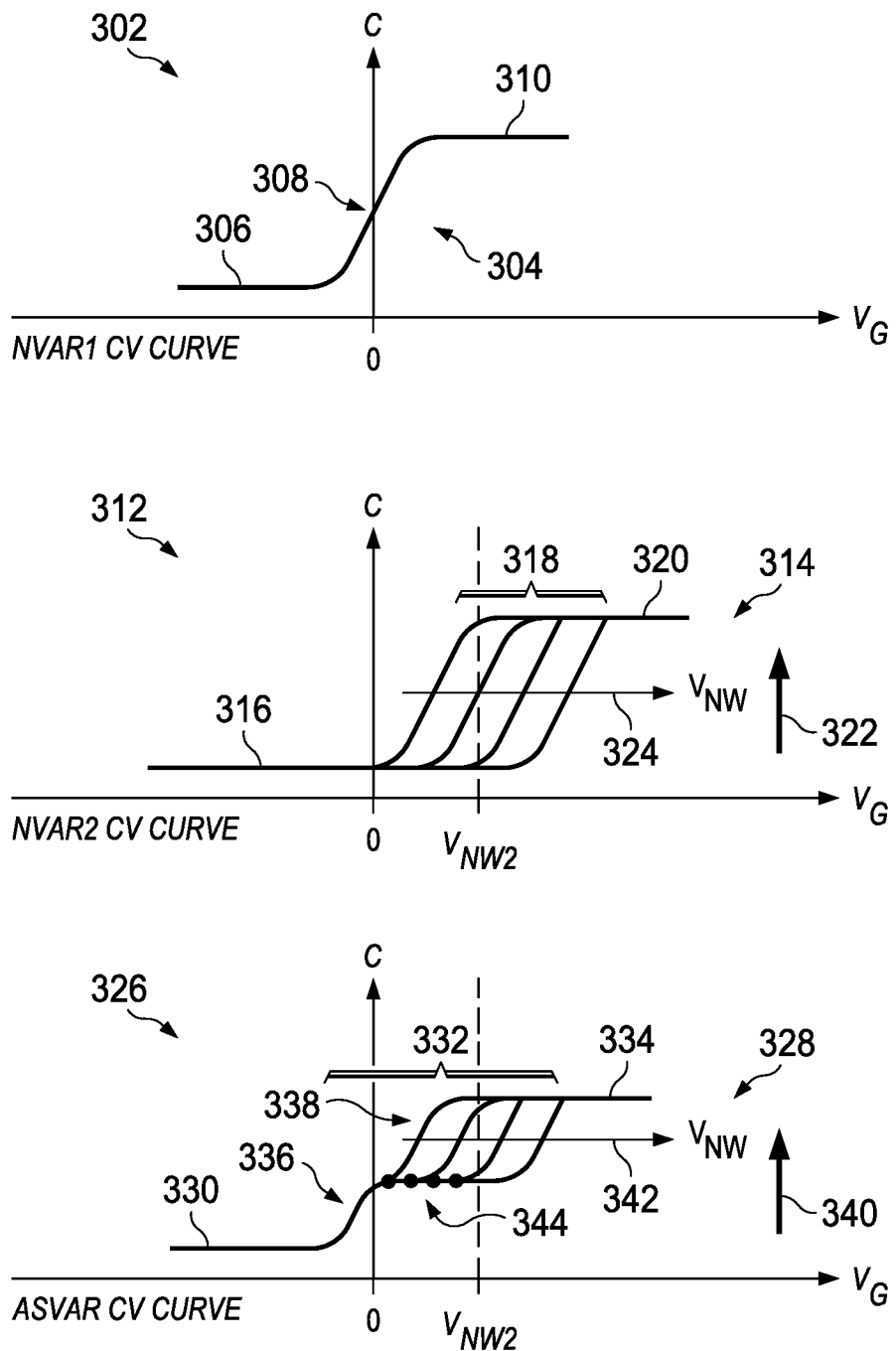
FIG. 3 is a diagram of the capacitance voltage curves related to an asymmetric varactor with an adaptive CV feature in accordance with the disclosure.

FIG. 3 is a diagram of the capacitance voltage curves related to an asymmetric varactor in accordance with the disclosure. Diagram 302 shows capacitance-voltage curve (CV curve) 304 for a first varactor, such as first n-type varactor 104 of FIG. 1. Capacitance voltage curve 304 is "S" shaped or sigmoidal. As voltage $V_G$ increases, capacitance C increases from minimum value 306 through linear portion 308 to maximum value 310. The location of linear portion 308 is fixed and independent of voltage $V_G$, which is the top plate bias for the asymmetric varactor.

Diagram 312 shows CV curve 314 for a second varactor of an asymmetric varactor, such as second n-type varactor 106 of asymmetric varactor 102 of FIG. 1. CV curve 314 is also sigmoidally shaped with capacitance C increasing from minimum value 316 through adjustable linear portion 318 to maximum value 320. The location of adjustable linear portion 318 varies based on second voltage $V_{NW}$ that is applied to the second varactor. Second voltage $V_{NW}$ is distinct from voltage $V_G$. In a preferred embodiment, as $V_{NW}$ increases (shown by arrow 322), adjustable linear portion 318 moves to the right (shown by arrow 324).

Diagram 326 shows CV curve 328 for an asymmetric varactor that is a combination of CV curves 304 and 314 and includes compound linear portion 332.

Compound linear portion 332 includes first portion 336 and second portion 338. First portion 336 does not move or shift in response to $V_{NW}$ while second portion 338 does move or shift in response to $V_{NW}$. In a preferred embodiment, as $V_{NW}$ increases (shown by arrow 340), second portion 338 shifts to the right (shown by arrow 342). CV points 344 are the midpoints of CV curve 328 that indicate, for a given voltage $V_{NW}$, a capacitance that is half way between minimum capacitance 330 and maximum capacitance 334. Four of CV points 344 are shown that correspond to four different $V_{NW}$ values. As $V_{NW}$ increases, the midpoint of CV curve 328 moves from left to right.

The shunt connection of two n-type MOS varactors, such as varactors 104 and 106 of FIG. 1 under a biased n-well condition via voltage $V_{NW}$ creates asymmetric CV curve 328 of FIG. 3. This asymmetry inhibits unwanted odd-harmonics without degradation of desired even-order harmonics. An additional benefit of using an asymmetric varactor stems from the adaptive CV with two degrees of freedom, i.e., top-plate bias ($V_G$) and n-well bias ($V_{NW}$). Having these two degrees of freedom allows for fine tuning optimum harmonic performance over multiple multiplication-orders and input power levels.

Figure 4A:
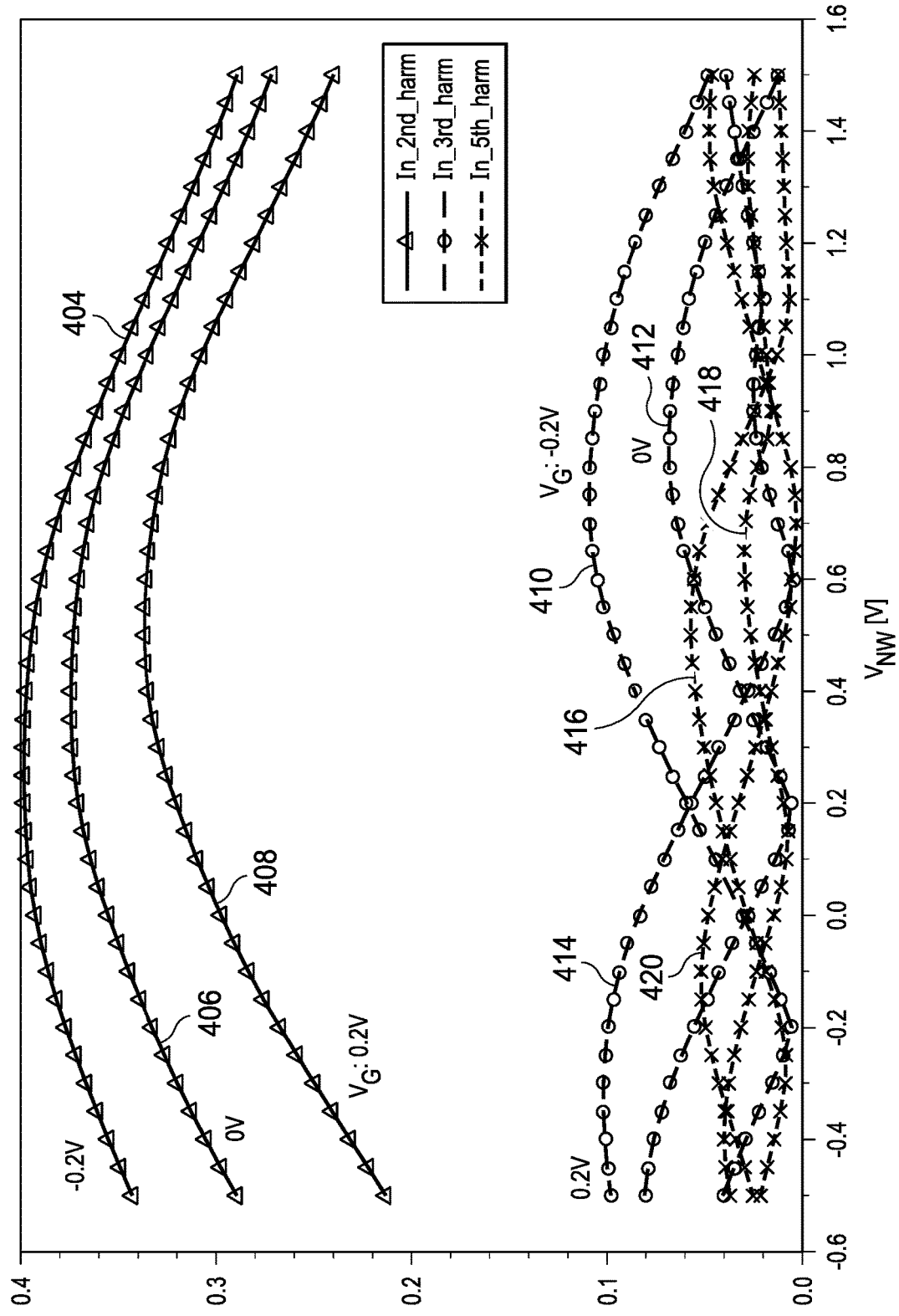
FIGS. 4A and 4B are diagrams of the superior even-order harmonic generation and odd-order harmonic rejection performance of an asymmetric varactor. All the harmonic currents are normalized to that of the fundamental current.
Figure 4B:
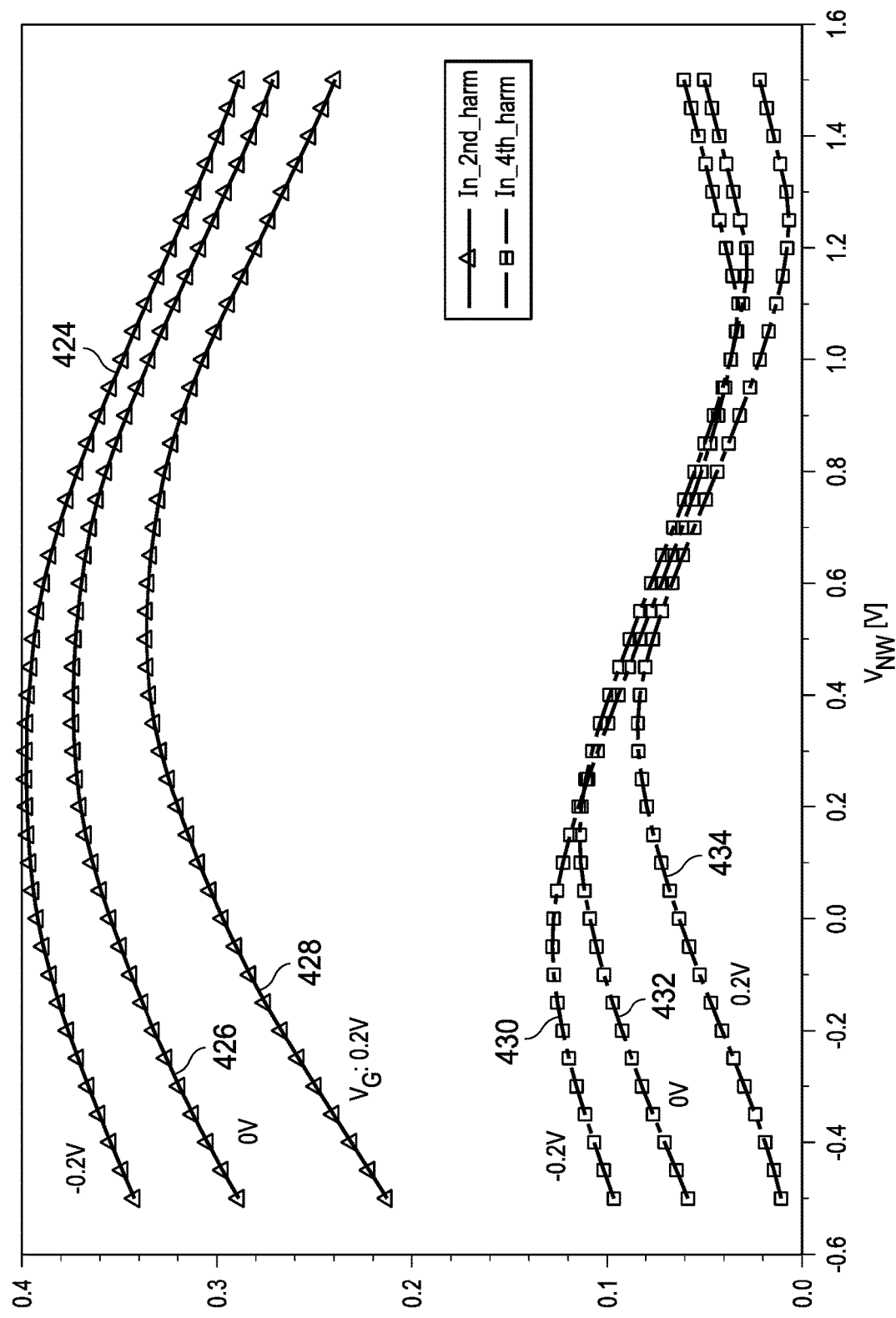

FIGS. 4A and 4B are diagrams of the superior even-order harmonic generation and odd-order harmonic rejection performance of an asymmetric varactor. FIGS. 4A and 4B show the load-pull current (y-axis) at $f_o$=60 GHz vs. $V_{NW}$ (x-axis) with $V_G$: −0.2, 0, 0.2V for an asymmetric varactor, such as asymmetric varactor 102 of FIG. 1.

FIG. 4A shows the fundamental current normalized second, third, and fifth harmonic currents on chart 402 for three values of $V_G$. Curve 404 is for the second harmonic when $V_G$ is −0.2 Volts (V), curve 406 is for the second harmonic when $V_G$ is 0 V, and curve 408 is for the second harmonic when $V_G$ is 0.2 V. Curve 410 is for the third harmonic when $V_G$ is −0.2 V, curve 412 is for the third harmonic when $V_G$ is 0V, and curve 414 is for the third harmonic when $V_G$ is 0.2 V. Curve 416 is for the fifth harmonic when $V_G$ is −0.2 V, curve 418 is for the fifth harmonic when $V_G$ is 0 V, and curve 420 is for the fifth harmonic when $V_G$ is 0.2 V.

FIG. 4B shows the fundamental current normalized second and fourth harmonic currents on chart 422 for three values of $V_G$. Curve 424 is for the second harmonic when $V_G$ is −0.2 Volts (V), curve 426 is for the second harmonic when $V_G$ is 0 V, and curve 428 is for the second harmonic when $V_G$ is 0.2 V. Curve 430 is for the fourth harmonic when $V_G$ is −0.2 V, curve 432 is for the fourth harmonic when $V_G$ is 0 V, and curve 434 is for the fourth harmonic when $V_G$ is 0.2 V.

Table 1 below shows the parameters used to simulate the performance of an asymmetric varactor to generate the curves of FIGS. 4A and 4B.

TABLE 1

| | |
|---|---|
| Gate Length (μm) | 0.1 |
| Gate Width (μm) | 0.3 |
| Number of Fingers | 11 each (22 total) |
| Fundamental RF Level, $V_{rf}$ | Forward-breakdown of 1.5 V |

Analysis of the asymmetric varactor under various $V_G/V_{NW}$ bias conditions shows the availability of excellent odd-harmonic rejection. The adaptive CV feature—the ability to control the CV curve of the asymmetric varactor via the $V_G$ and $V_{NW}$ voltages—allows for the several null values where the load-pull current is substantially 0 amperes (A) for the odd harmonics as shown in FIG. 4A. In addition to the first degree of freedom provided by $V_G$, the second degree of freedom offered by $V_{NW}$ combined with the higher CV nonlinearity allows for optimum even-harmonic generation with minimal or negligible odd-harmonics. This improves performance by conserving energy without additional symmetry restrictions, such as with symmetric varactors. FIG. 4B shows that the asymmetric varactor is capable of superior frequency doubler (i.e., 2 $f_o$) performance due to relatively non-overlapping optimums for the 2 $f_o$ outputs (shown by second harmonic curves 424, 426, and 428) and $4f_0$ (i.e., frequency quadrupler) outputs (shown by fourth harmonic curves 430, 432, and 434) for each of the $V_G/V_{NW}$ bias conditions.

Figure 5A:
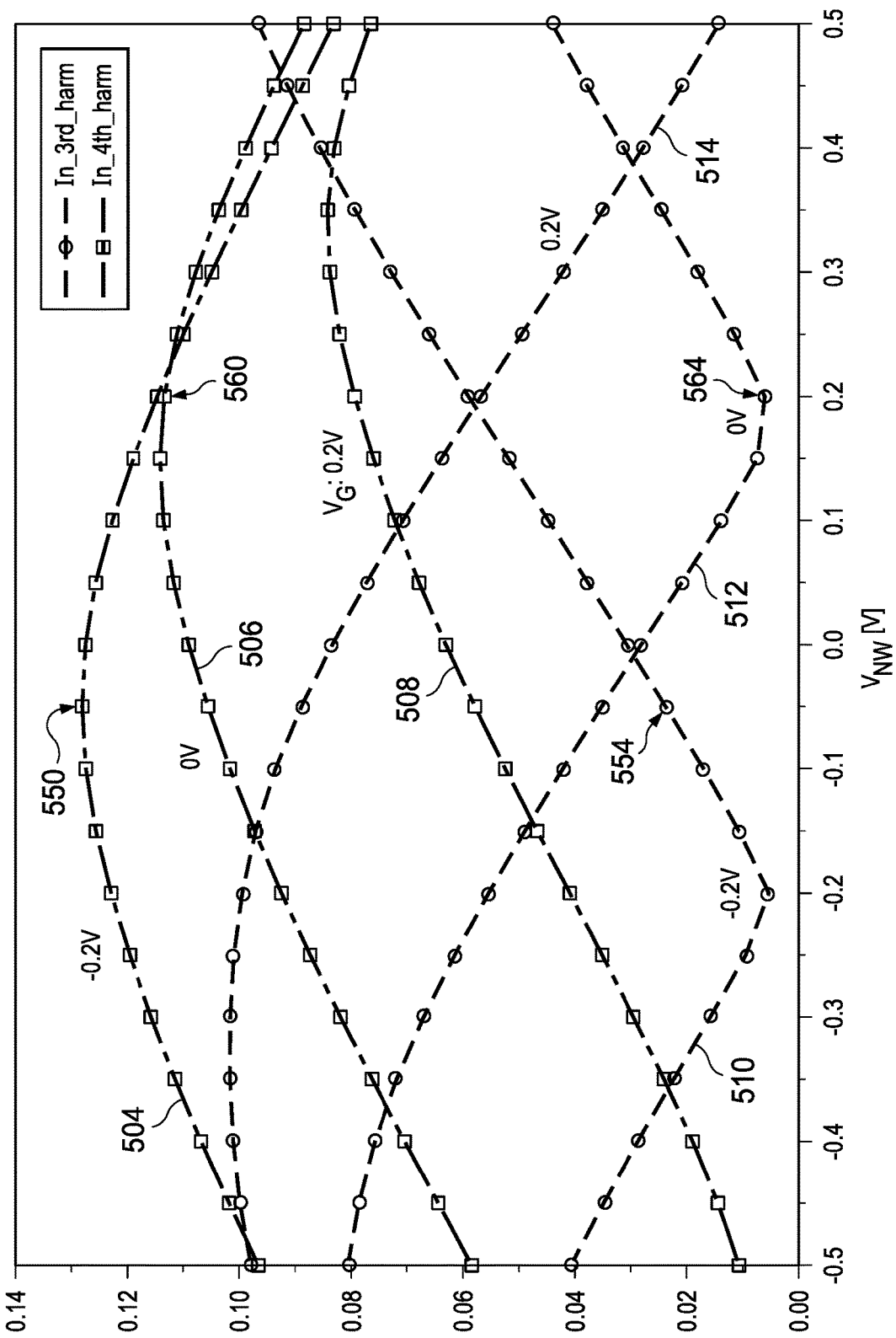
FIGS. 5A, 5B, and 5C are diagrams of the superior even-order harmonic generation and odd-order harmonic rejection performance of an asymmetric varactor. All the harmonic currents are normalized to that of the fundamental current.
Figure 5B:
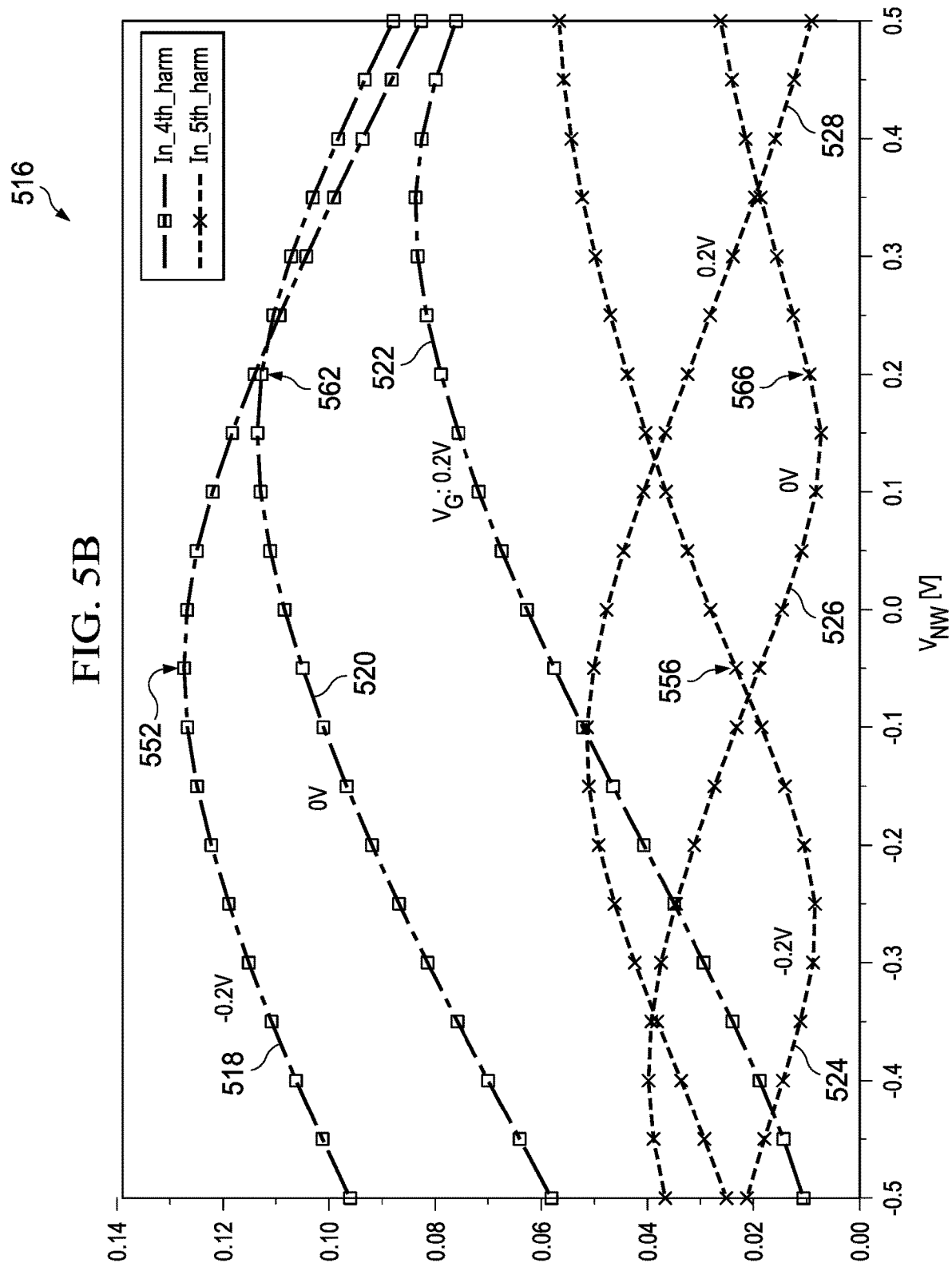
Figure 5C:
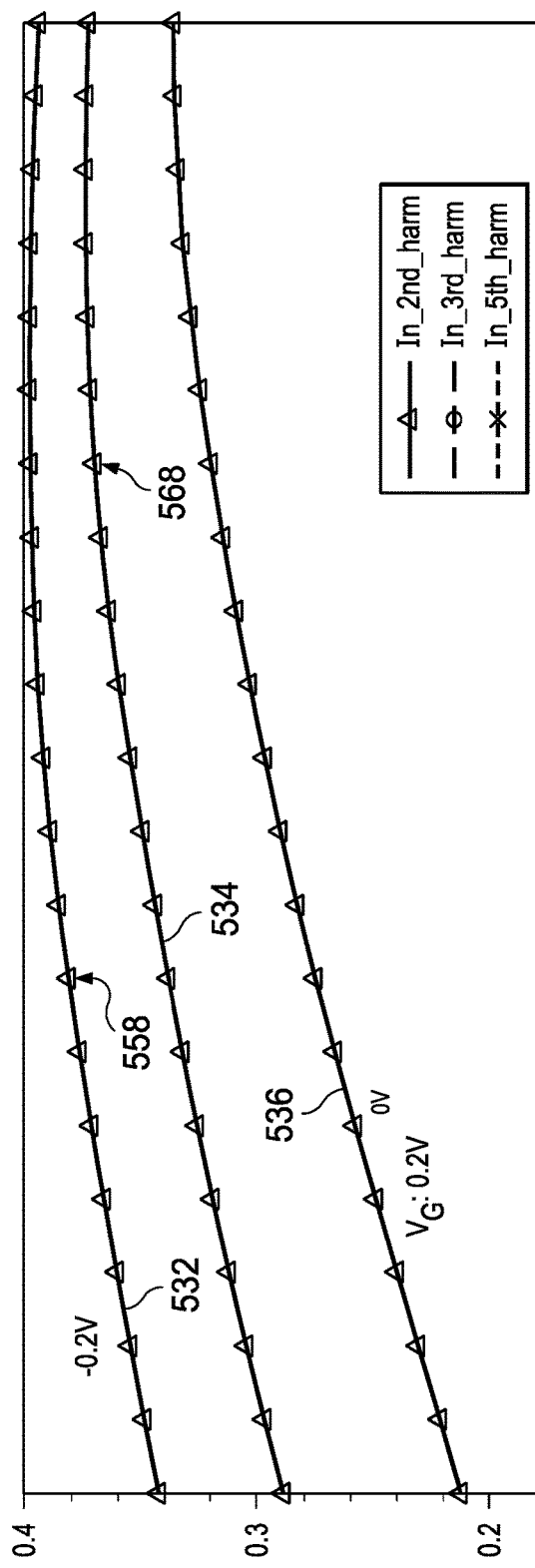

FIGS. 5A, 5B, and 5C are diagrams of the superior even-order harmonic generation and odd-order harmonic rejection performance of an asymmetric varactor. All the harmonic currents are normalized to that of the fundamental current.

FIGS. 5A, 5B, and 5C show the load-pull current (y-axis) at $f_o$=30 GHz vs. $V_{NW}$ (x-axis) with $V_G$: -0.2, 0, 0.2 V for an asymmetric varactor, such as asymmetric varactor 102 of FIG. 1.

FIG. 5A shows the fundamental current normalized third and fourth harmonic currents on chart 502. Curve 504 is for the fourth harmonic when $V_G$ is -0.2 Volts (V), curve 506 is for the fourth harmonic when $V_G$ is 0 V, and curve 508 is for the fourth harmonic when $V_G$ is 0.2 V. Curve 510 is for the third harmonic when $V_G$ is -0.2 V, curve 512 is for the third harmonic when $V_G$ is 0 V, and curve 514 is for the third harmonic when $V_G$ is 0.2 V.

FIG. 5B shows the fundamental current normalized fourth and fifth harmonic currents on chart 516 with $V_G$: -0.2, 0, 0.2 V. Curve 518 is for the fourth harmonic when $V_G$ is -0.2 Volts (V), curve 520 is for the fourth harmonic when $V_G$ is 0 V, and curve 522 is for the fourth harmonic when $V_G$ is 0.2 V. Curve 524 is for the fifth harmonic when $V_G$ is -0.2 V, curve 526 is for the fifth harmonic when $V_G$ is 0 V, and curve 528 is for the fifth harmonic when $V_G$ is 0.2 V.

FIG. 5C shows the fundamental current normalized second, third, and fifth on chart 530 harmonic currents with $V_G$: -0.2, 0, 0.2 V. Curve 532 is for the second harmonic when $V_G$ is -0.2 V, curve 534 is for the second harmonic when $V_G$ is 0 V, and curve 536 is for the second harmonic when $V_G$ is 0.2 V. Curve 538 is for the third harmonic when $V_G$ is -0.2 V, curve 540 is for the third harmonic when $V_G$ is 0 V, and curve 542 is for the third harmonic when $V_G$ is 0.2 V. Curve 544 is for the fifth harmonic when $V_G$ is -0.2 V, curve 546 is for the fifth harmonic when $V_G$ is 0 V, and curve 548 is for the fifth harmonic when $V_G$ is 0.2 V.

The odd-harmonic cancellations and adaptive CV benefits of an asymmetric varactor are more pronounced in higher-order (>2) multiplications. FIGS. 5A, 5B, and 5C demonstrate one such scenario with a fourth-order multiplier, i.e., a frequency quadrupler. With a first bias point of $V_G$=0 V and $V_{NW}$=0.2 V, fourth harmonic curves 504 and 518 are at maximums 550 and 552 of FIGS. 5A and 5B. The first bias point corresponds point 554 on curve 510 of FIG. 5A for the third harmonic, point 556 on curve 524 of FIG. 5B for the fifth harmonic, and point 558 on curve 532 of FIG. 5C for the second harmonic. A better bias point is where $V_G$=0 V and $V_{NW}$=0.2 V that corresponds to points 560 and 562 on curves 506 and 520 of FIGS. 5A and 5B for the fourth harmonic, point 564 on curve 512 of FIG. 5A for the third harmonic, point 566 on curve 526 of FIG. 5B for the fifth harmonic, and point 568 on curve 534 of FIG. 5C for the second harmonic. For the second bias point, even though the fourth harmonic is not at a maximum, this is made up for by the third and fifth harmonics being at or near minimums leading to a better overall performance as compared to the first bias point. This level of freedom created by the use of two bias signals ($V_G$ and $V_{NW}$) is non-existent in conventional multipliers.

Figure 6A:
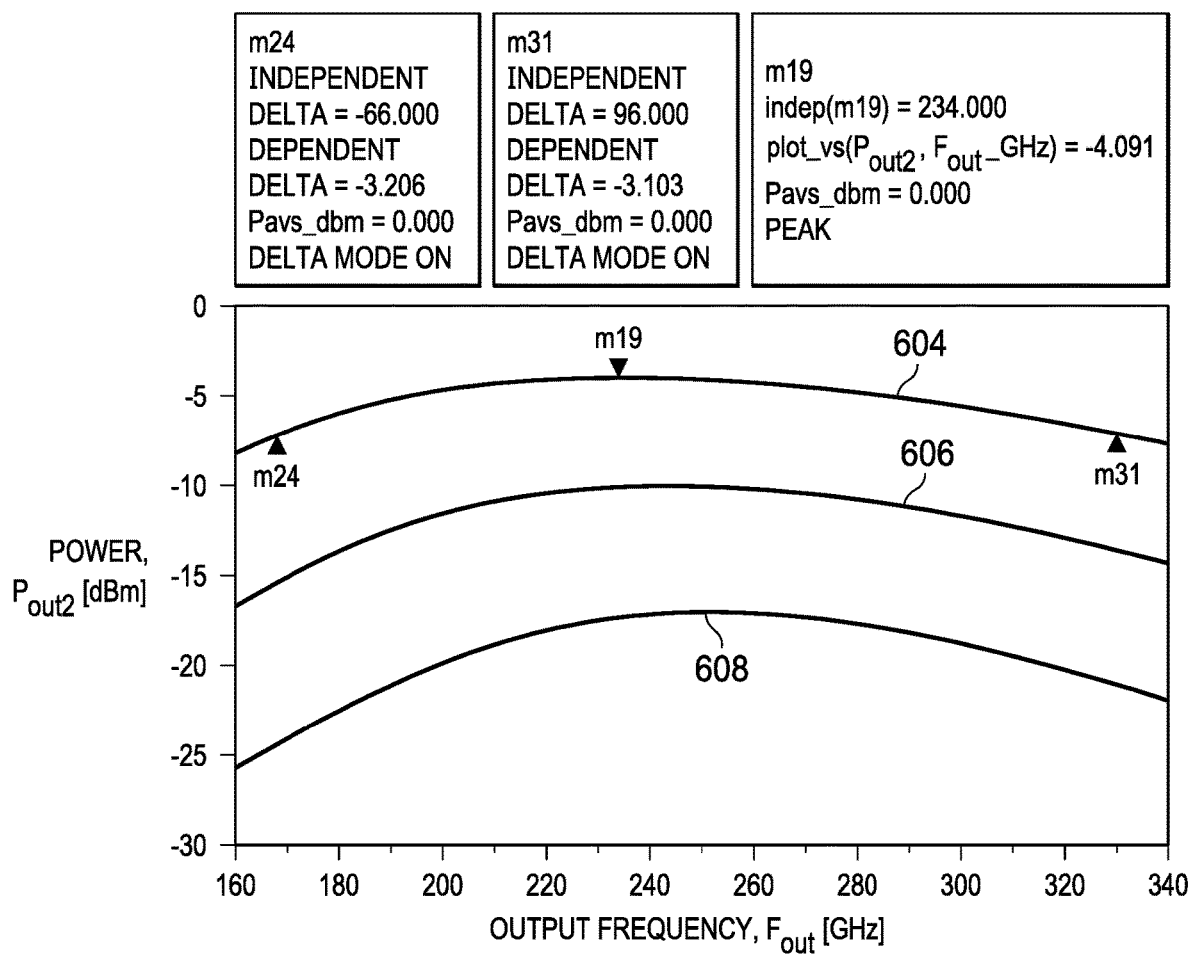
FIGS. 6A, 6B, 6C, and 6D are diagrams of the performance of an asymmetric varactor configured as an ultra-wideband frequency doubler with superior harmonic-rejection.
Figure 6B:
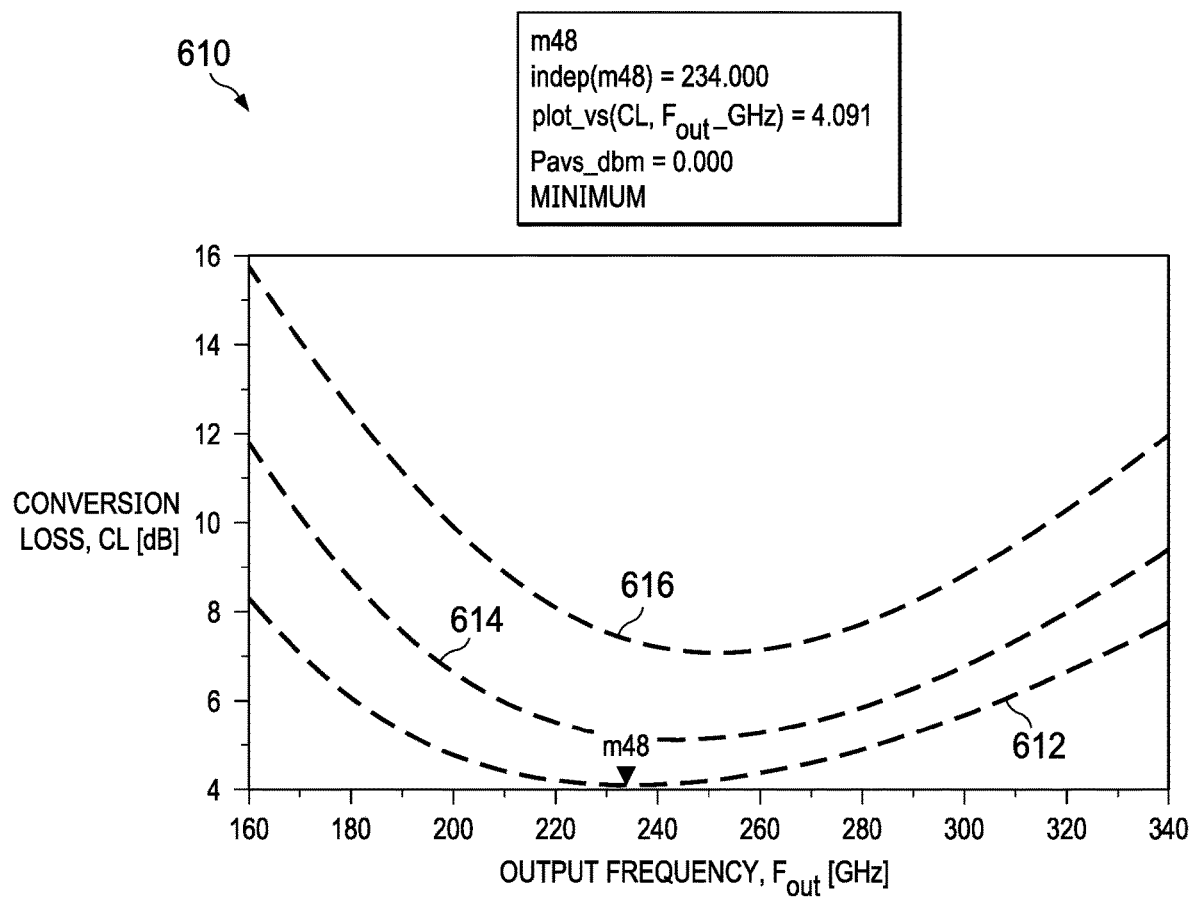
Figure 6C:
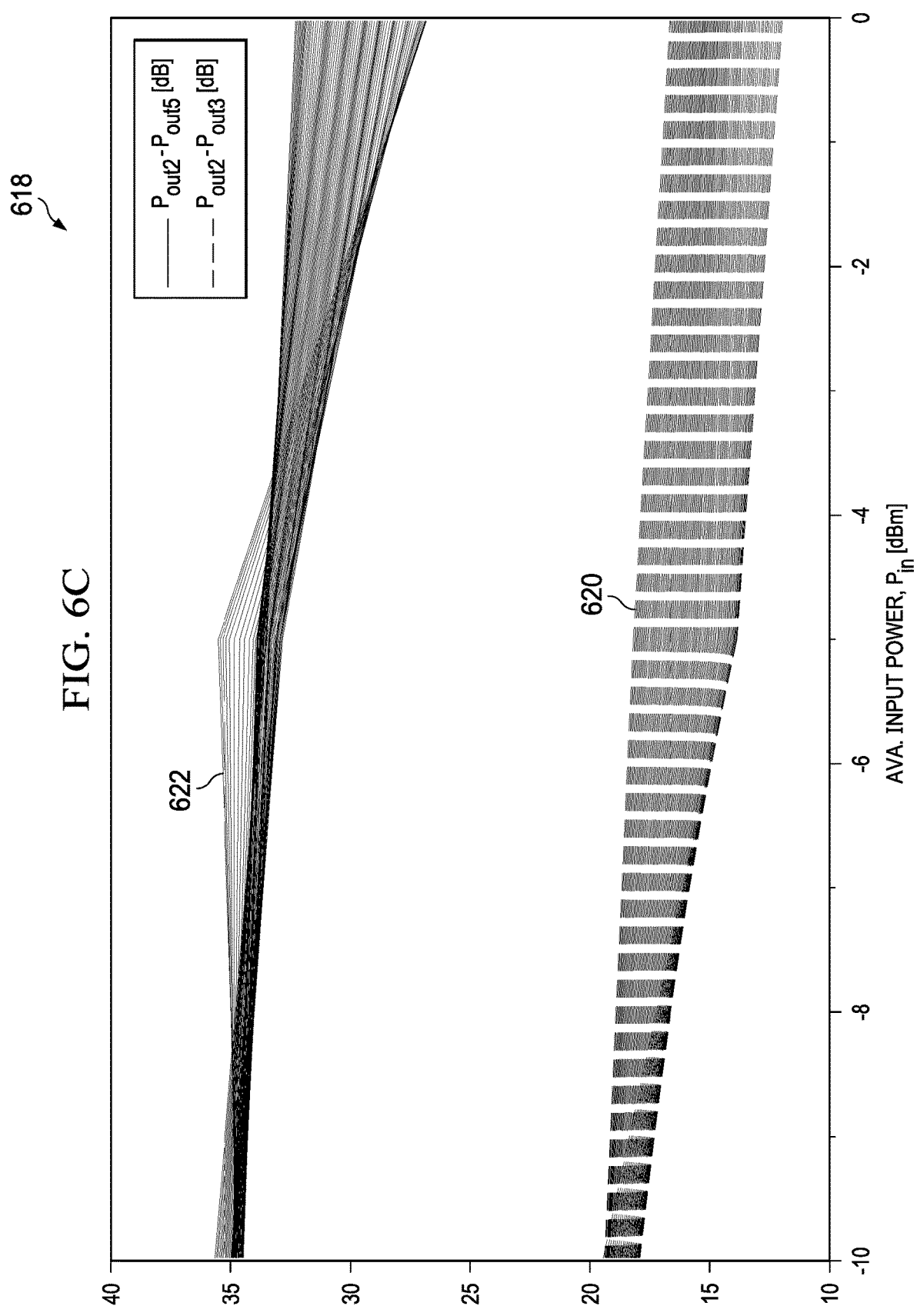
Figure 6D:
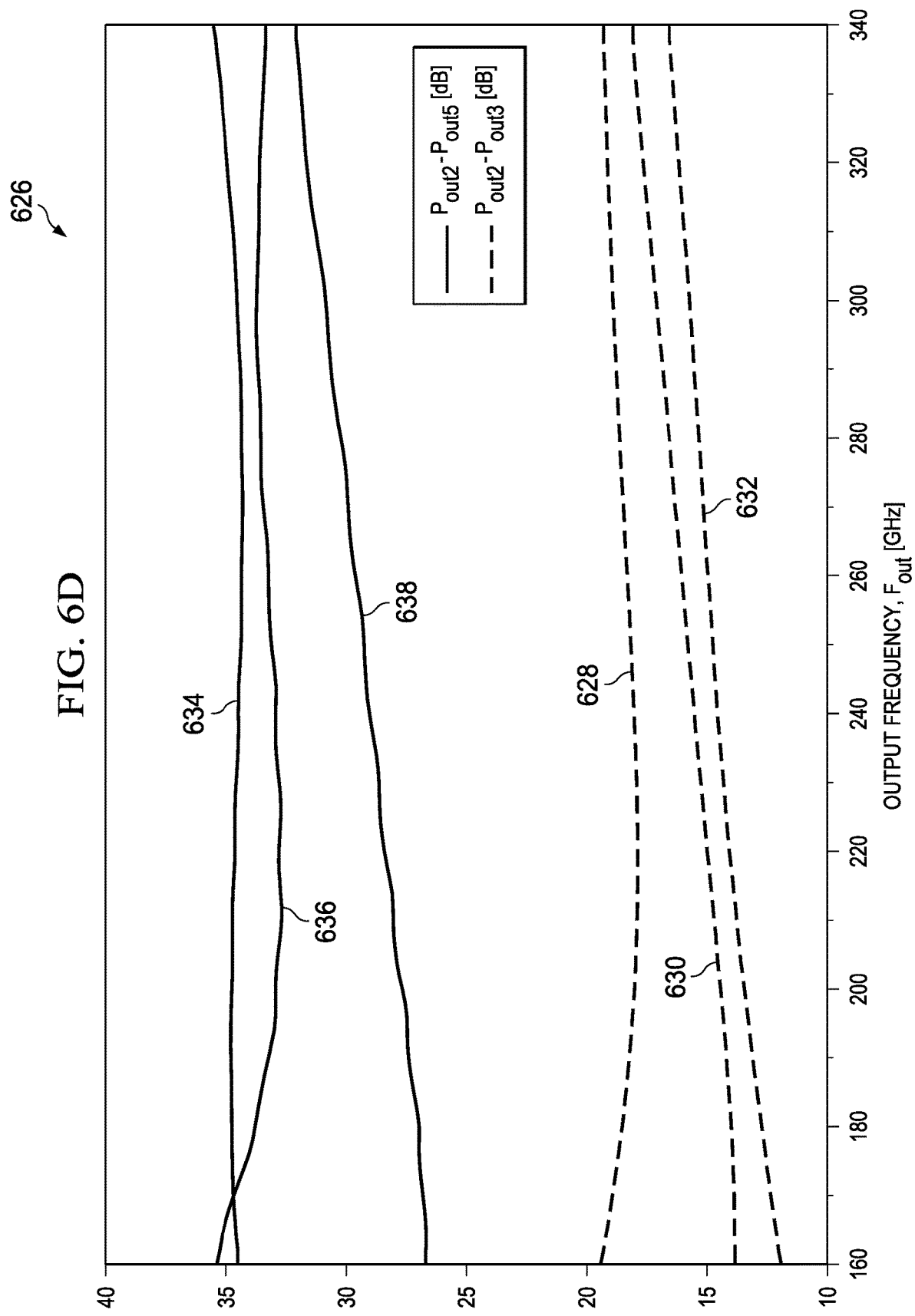

FIGS. 6A, 6B, 6C, and 6D show simulated performance of an asymmetric varactor-based frequency doubler using $V_G/V_{NW}$=-0.1 V/0.6 V and $P_{in}$ of -10, -5, and 0 dBm. FIG. 6A shows graph 602 of $P_{out}$ vs. frequency in gigahertz with curve 604 for $P_{IN}$ of 0 dBm, curve 606 for $P_{IN}$ of -5 dBm, and curve 608 for $P_{IN}$ of -10 dBm. Point m19 on curve 604 of graph 602 show that a frequency of 234 GHz yields a power of -4.091 dBm. Points m24 and m31 on curve 604 of graph 602 show the wide operating bandwidth of 162 GHz with a maximum drop of -3.206 dBm over that bandwidth. Point m48 on curve 612 of graph 610 shows the minimum conversion loss of 4.091 dBm at 234 GHz. FIG. 6B shows graph 610 of conversion loss (CL) in dB vs. frequency in gigahertz with curve 612 for $P_{IN}$ of 0 dBm, curve 614 for $P_{IN}$ of -5 dBm, and curve 616 for $P_{IN}$ of -10 dBm. FIG. 6C shows graph 618 of third harmonic output ($P_{out3}$, curve 620) & fifth harmonic output ($P_{out5}$, curve 622) power levels with respect to second harmonic ($P_{out2}$) vs. the input power ($P_{in}$ or $P_{avs\_dbm}$). FIG. 6D shows graph 626 of third harmonic output ($P_{out3}$, curves 628, 630, and 632) & fifth harmonic output ($P_{out5}$, curves 634, 636, and 638) power levels with respect to second harmonic ($P_{out2}$) vs. output frequency in gigahertz.

The asymmetric varactor based passive doubler for FIGS. 6A, 6B, 6C, and 6D is designed with the parameters from Table 1, except that the number of fingers is nine for each varactor for a total of eighteen fingers in the asymmetric varactor. At $P_{in}$=0 dBm, $V_G/V_{NW}$=-0.1 V/0.6 V, the doubler demonstrates a 3 dB bandwidth of 67.5% with peak $P_{out}$ of about -4 dBm at 234 GHz in FIG. 6A and a minimum CL of about 4 dB at 234 GHz in FIG. 6B. FIG. 6D in particular shows the asymmetric varactor has excellent odd-harmonic rejection properties over the whole bandwidth of interest from 160 GHz to 340 GHz with each curve being substantially flat.

Figure 7A:
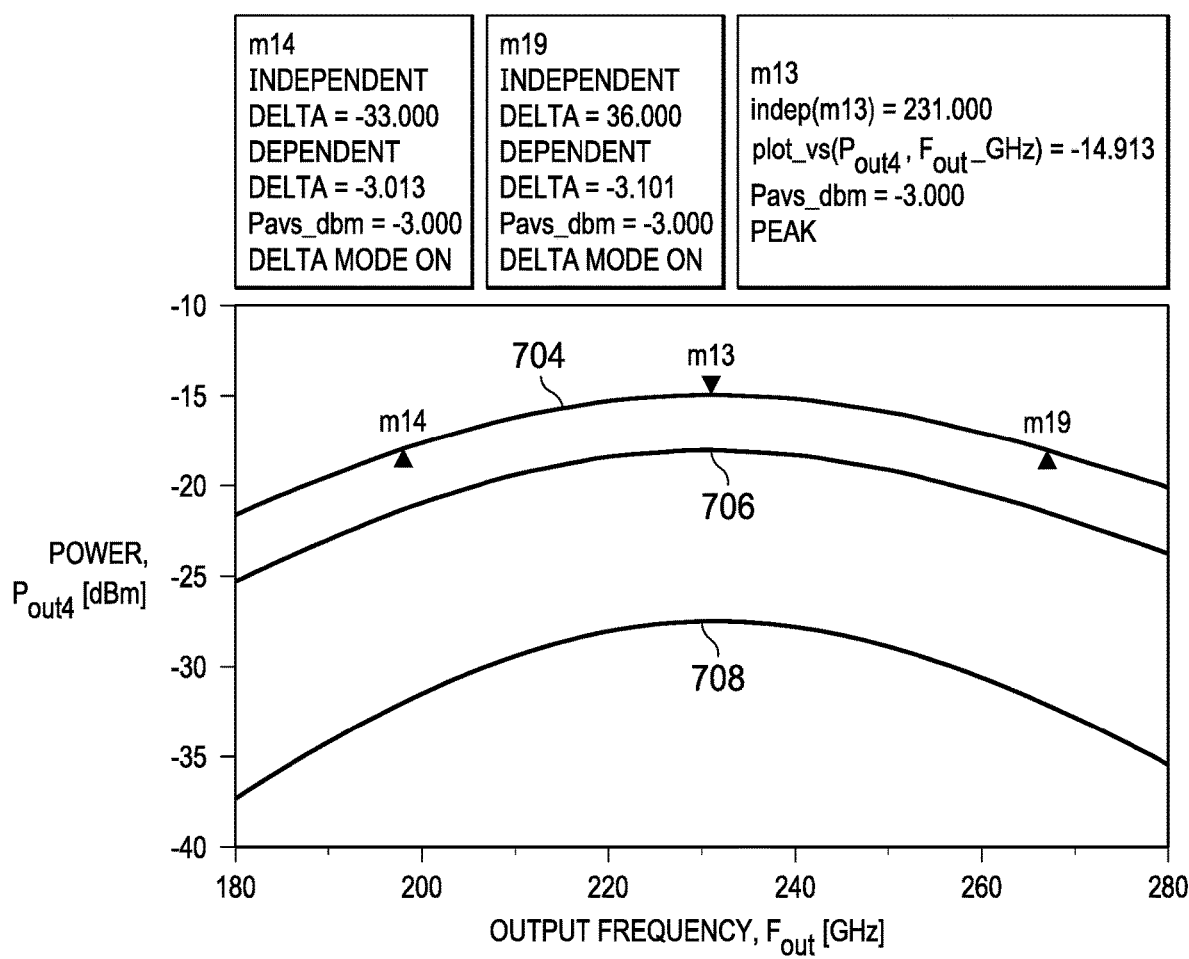
FIGS. 7A, 7B, and 7C are diagrams of the superior performance of an asymmetric varactor as a frequency quadrupler over wide bandwidths and under varying input power levels.
Figure 7B:
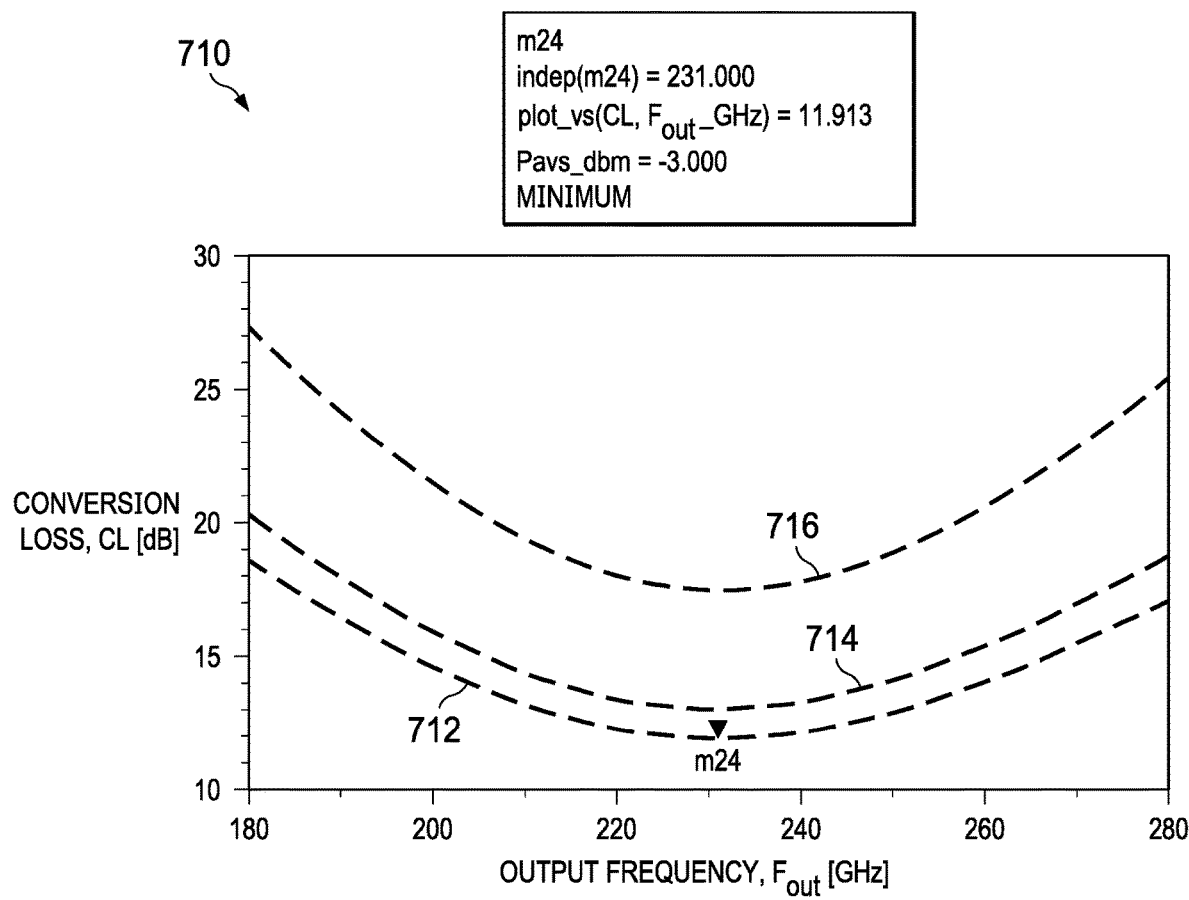
Figure 7C:
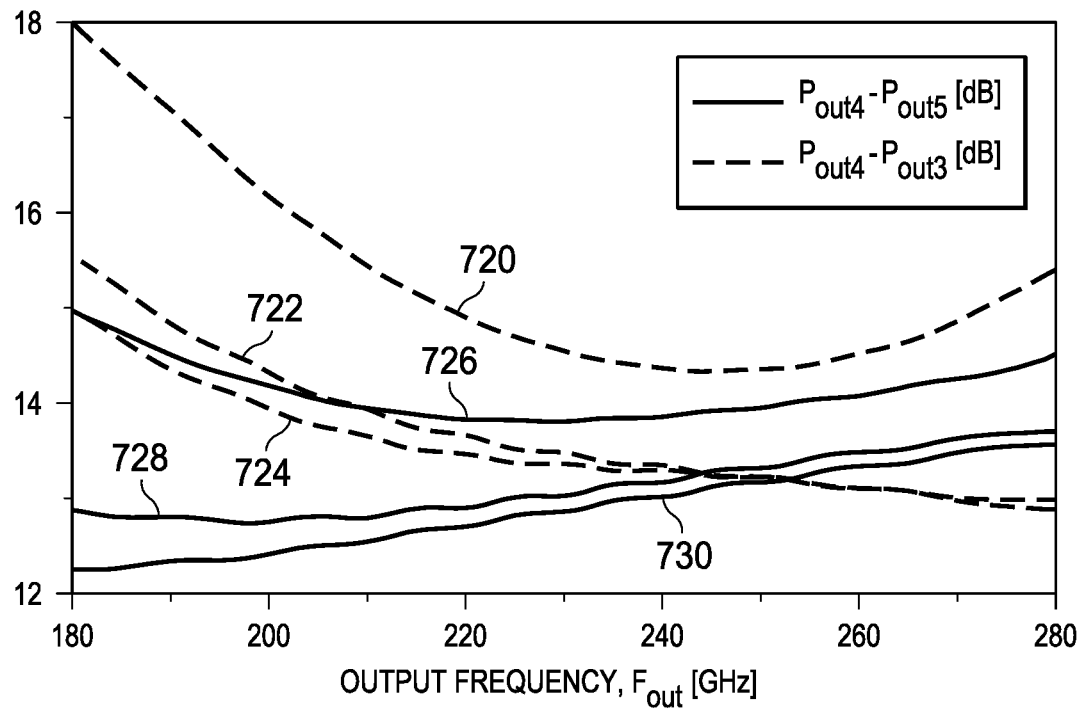

FIGS. 7A, 7B, and 7C are diagrams of the performance of an asymmetric varactor. FIGS. 7A, 7B, and 7C show simulated performance of an asymmetric varactor-based frequency quadrupler using $V_G/V_{NW}$=0 V/0.25 V and $P_{in}$ of -10, -5, and -3 dBm. FIG. 7A shows graph 702 of the fourth harmonic output power ($P_{out4}$) in dBm vs. frequency in GHz with curve 704 for $P_{IN}$ of -3 dBm, curve 706 for $P_{IN}$ of -5 dBm, and curve 708 for $P_{IN}$ of -10 dBm. Point m13 on curve 704 of graph 702 show that frequency is 231 GHz yields a power of -14.913 dBm. Points m14 and m19 on curve 704 of graph 702 show the wide operating bandwidth of 69 GHz and a maximum drop of -3.101 dBm. FIG. 7B shows graph 710 of CL in dB vs. frequency in GHz with curve 712 for $P_{IN}$ of -3 dBm, curve 714 for $P_{IN}$ of -5 dBm, and curve 716 for $P_{IN}$ of -10 dBm. Point m24 on curve 712 of graph 710 shows the minimum conversion loss of 11.913 dBm at 231 GHz. FIG. 7C shows graph 718 of third harmonic output ($P_{out3}$, curves 720, 722, and 724) & fifth harmonic output ($P_{out5}$, curves 726, 728, and 730) power levels with respect to fourth harmonic ($P_{out4}$) vs. output frequency in GHz.

Significant benefits of anti-symmetric CV characteristics manifest profoundly in high-order (>2) multiplication. Simulation results for a quadrupler (fourth order multiplier) are presented in FIGS. 7A, 7B, and 7C using an asymmetric varactor. The asymmetric varactor is capable of achieving significant peak $P_{out}$ and $CL_{min}$ with a monotonic response with respect to $P_{in}$ over entire operating bandwidth free of any kinks as shown by the smooth curves in each of FIGS. 7A, 7B, and 7C. This aspect manifests itself in a wider realized bandwidth for the asymmetric varactor quadrupler. As for the important issue of odd-order harmonic rejection, the asymmetric varactor outperforms conventional technologies and does so while only requiring a resistive short as opposed to the complex termination conditions required by other technologies to achieve optimum performance. Further improvements in performance and benefits such as post-fabrication frequency-response tweaking, process variations resilience, and optimum CL at various input power levels can be realized by the adaptive $V_G/V_{NW}$ bias of the asymmetric varactor.

Figure 8:
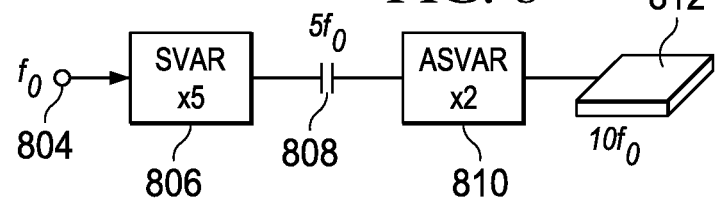
FIG. 8 is a block diagram of a symmetric and asymmetric varactor based frequency multiplier in accordance with the disclosure.

FIG. 8 is a block diagram of a frequency multiplier in accordance with the disclosure. In one preferred embodiment, a 1.4 terahertz (THz) multiplier chain of the tenth order is realized using a symmetric varactor and an asymmetric varactor in a 65 nanometer (nm) standard CMOS process. The circuit produces −13 dBm of peak equivalent isotropically radiated power (EIRP) at 1.33 THz and operates over a setup limited bandwidth of more than 11%. The fully integrated multiplier chain does not require any silicon lens or substrate thinning making it a compact and affordable solution for emerging THz applications.

Frequency multiplier chain 802 includes input terminal 804 to which the initial input signal is applied. The initial input signal has a frequency of $f_0$=140 GHz and is fed into symmetric varactor 806.

Symmetric varactor 806 is configured as a frequency quintupler that outputs a signal with a frequency of $5f_0$=0.7 THz that is five times the input frequency of $f_0$. Symmetric varactor 806 is coupled to asymmetric varactor 810 via coupling capacitor 808.

Coupling capacitor 808 passes the alternating current (AC) signal from symmetric varactor 806 to asymmetric varactor 810 while substantially blocking the direct current (DC) signal from symmetric varactor 806.

Asymmetric varactor 810 takes the quintupled signal ($5f_0$) from symmetric varactor 806 and further doubles the signal to a frequency of $10f_0$=1.4 THz, which is ten times the original input signal $f_0$. The output from asymmetric varactor 810 is passed to load 812, which may be an antenna.

Figure 9:
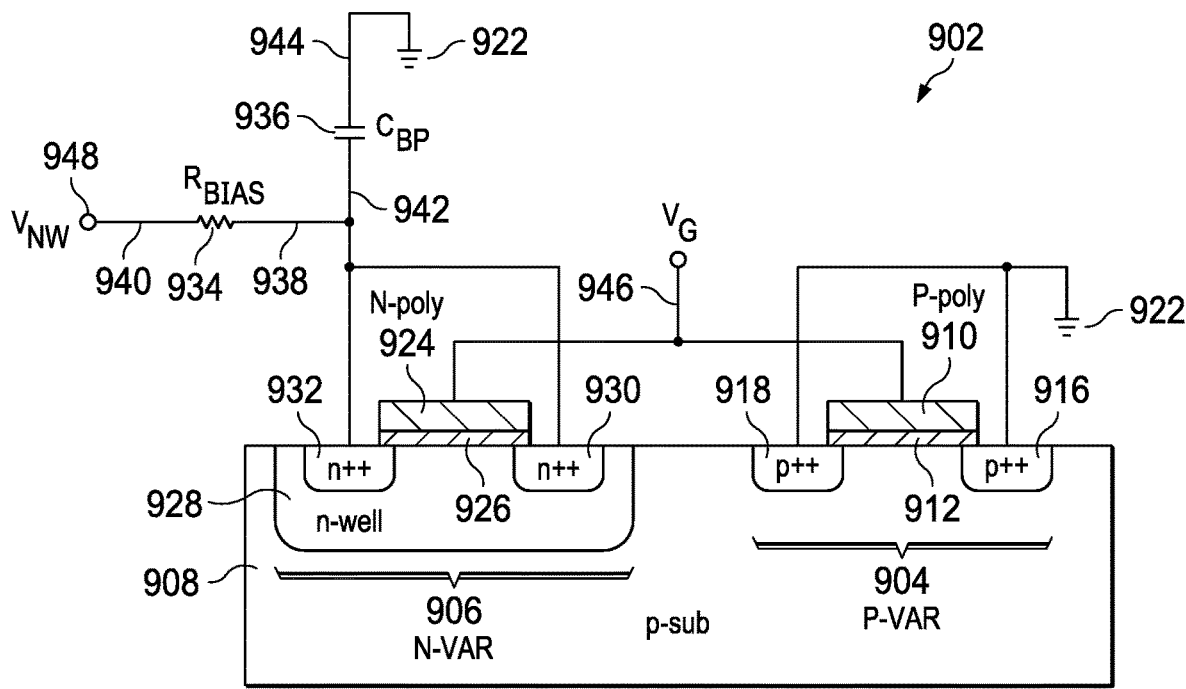
FIG. 9 is a combination view that shows a three dimensional cross section of a symmetric varactor (SVAR) along with a schematic of electrical connections in accordance with the disclosure.

FIG. 9 is a combination view that shows a three dimensional cross section of a symmetric varactor (SVAR) along with a schematic of electrical connections in accordance with the disclosure. Symmetric varactor 806 of FIG. 8 is an embodiment of symmetric varactor 902. Symmetric varactor 902 can be formed in a standard CMOS process by parallel connection of n-type and p-type accumulation-mode MOS varactors as shown in FIG. 9. The inherent CV symmetry of symmetric varactors leads to efficient odd-order harmonic generation and even-order harmonic suppression. Additionally, the adaptive CV feature through n-well bias allows optimum operation under varying input power levels. Symmetric varactor 902 is different from an asymmetric varactor in that the doping type of the material used to form first p-type varactor 904 is the opposite or complement of the doping type of the material used to form second n-type varactor 906.

First p-type varactor 904 includes p-type polycrystalline silicon (p-poly) 910, gate oxide 912 (silicon dioxide), first heavily doped p-type area (p++ area) 916, second p++ area 918. First p-type varactor 904 is a metal oxide semiconductor (MOS) device. P-poly 910 acts as the metal layer of first p-type varactor 904, gate oxide 912 acts as the oxide layer of first p-type varactor 904, and the portion of p-sub 908 beneath gate oxide 912 acts as the semiconductor layer of first p-type varactor 904.

First p++ area 916 and second p++ area 918 are electrically connected to ground 922.

Second n-type varactor 906 includes n-type polycrystalline silicon (n-poly) 924, gate oxide 926 (silicon dioxide), n-type well (n-well) 928, first heavily doped n-type area (n++ area) 930, second n++ area 932. Second n-type varactor 906 is also a metal oxide semiconductor (MOS) device. N-poly 924 acts as the metal layer of second n-type varactor 906, gate oxide 926 acts as the oxide layer of second n-type varactor 906, and n-well 928 acts as the semiconductor layer of second n-type varactor 906.

First n++ area 930 and second n++ area 932 are electrically connected to resistor 934 and capacitor 936.

Figure 14:
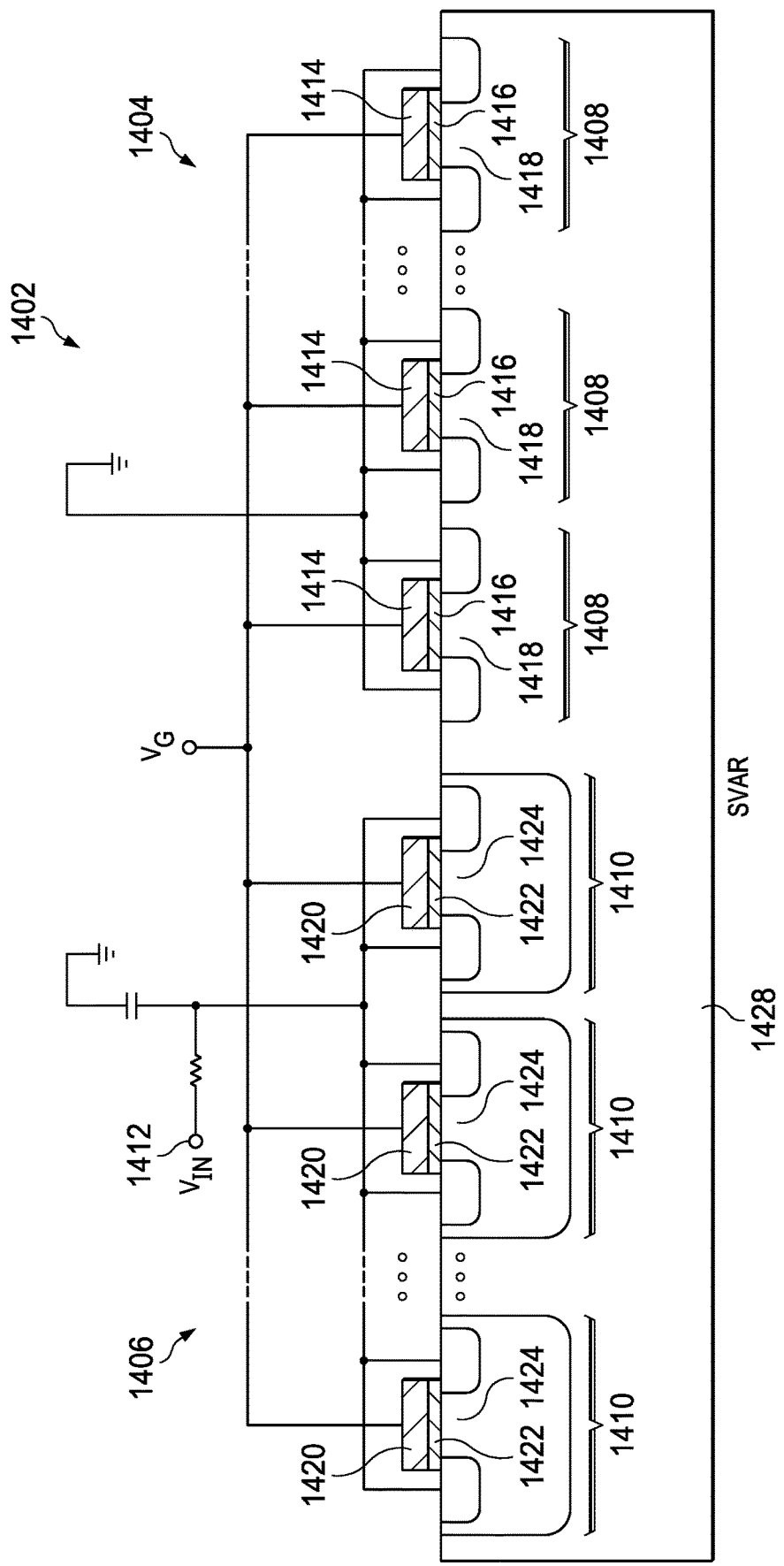
FIG. 14 is a combination view of a symmetric varactor with multiple fingers.

First p-type varactor 904 and second n-type varactor 906 are each formed as having a single finger. Additional or alternative embodiments may have one or more additional fingers for either or both of first p-type varactor 904 and second n-type varactor 906. FIG. 14, discussed below, shows one embodiment of a symmetric varactor with multiple fingers for each varactor that form the asymmetric varactor. Each finger of a varactor comprises a copy of the semiconductor regions of the varactor and each finger is electrically connected in parallel. Using multiple fingers allows for larger powers, voltages, and currents to be used.

For resistor 934, a first terminal 938 is connected to first n++ area 930, second n++ area 932, and capacitor 936. Second terminal 940 of resistor 934 is connected to second terminal 948, which provides the input for the n-well voltage $V_{NW}$ to bias second n-type varactor 906 and control the location of a linear portion of the CV curve for second n-type varactor 906 and symmetric varactor 902.

For capacitor 936, a first terminal 942 is connected to first n++ area 930, second n++ area 932, and resistor 934. Second terminal 944 of capacitor 936 is connected to ground 922.

$V_G$ is the top plate bias voltage, also referred to as a first bias signal, which is applied to first terminal 946. First terminal 946 is electrically connected to p-poly layer 910 of first p-type varactor 904 and n-poly 924 of second n-type varactor 906 so as to commonly connect each of the metal layers of varactors 904 and 906.

The semiconductor layers of varactors 904 and 906 are not commonly connected so that the semiconductor layer of first p-type varactor 904 (i.e., the portion of p-sub 908 beneath gate oxide 912) can be grounded while the semiconductor layer of second n-type varactor 906 (i.e., n-well 928) can be biased by $V_{NW}$ to create a symmetric capacitance-voltage (CV) curve for symmetric varactor 902. $V_{NW}$ is the well bias voltage, also referred to as a second bias signal, which is applied to second terminal 948 that is substantially a direct current (DC) voltage. $V_{NW}$ controls the bias of n-well 928 to affect the CV characteristics of second n-type varactor 106 and symmetric varactor 902.

Figure 10:
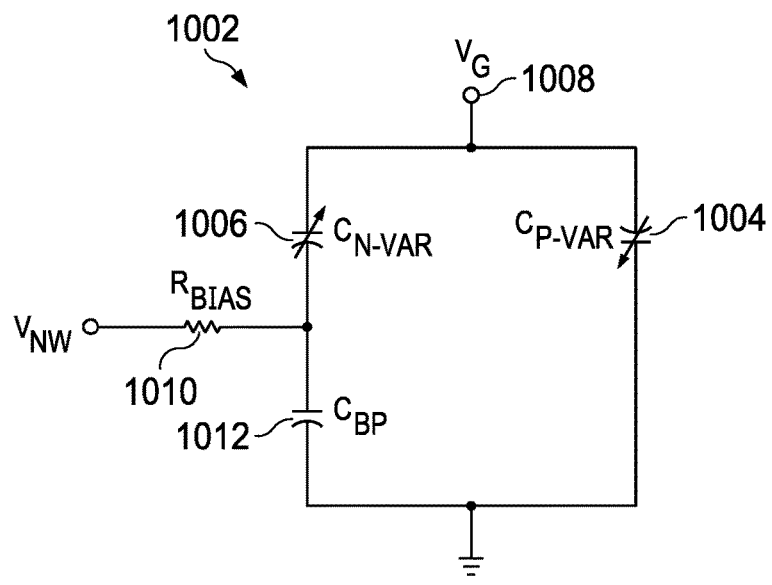
FIG. 10 is an electrical schematic of a symmetric varactor in accordance with the disclosure.

FIG. 10 is an electrical schematic of a symmetric varactor in accordance with the disclosure. Symmetric varactor 1002 is an embodiment of a symmetric varactor, such as symmetric varactor 902 of FIG. 9. Symmetric varactor 1002 includes varactors 1004 and 1006 that are of complimentary or opposite doping types. First and second varactors 1004 and 1006 are shown with the electrical symbols for variable capacitors and labeled as $C_{P-VAR}$ and $C_{N-VAR}$. With the doping type of first varactor 1004 labeled as $C_{P-VAR}$ being the opposite of second varactor 1006 labeled as $C_{N-VAR}$, the polarities of the first and second varactors 1004 and 1006 are reversed, as shown in FIG. 10.

$V_G$ is the top plate bias voltage and is applied to first terminal 1008. Symmetric varactor 1002 outputs a signal that includes an odd order harmonic of the frequency of the input signal.

$V_{NW}$ is the voltage applied to the symmetric varactor to control the bias of an n-well of second varactor 1006 to change the response characteristics of the second varactor 1006 and of symmetric varactor 1002.

Resistor 1010 (labeled as $R_{BIAS}$) biases the n-well of the second varactor allowing the CV curve of second varactor 1006 and symmetric varactor 1002 to be changed and tuned.

Capacitor 1012 (labeled as $C_{BP}$) is a bypass capacitor and substantially removes the alternating current (AC) component or noise from $V_{NW}$.

Figure 11:
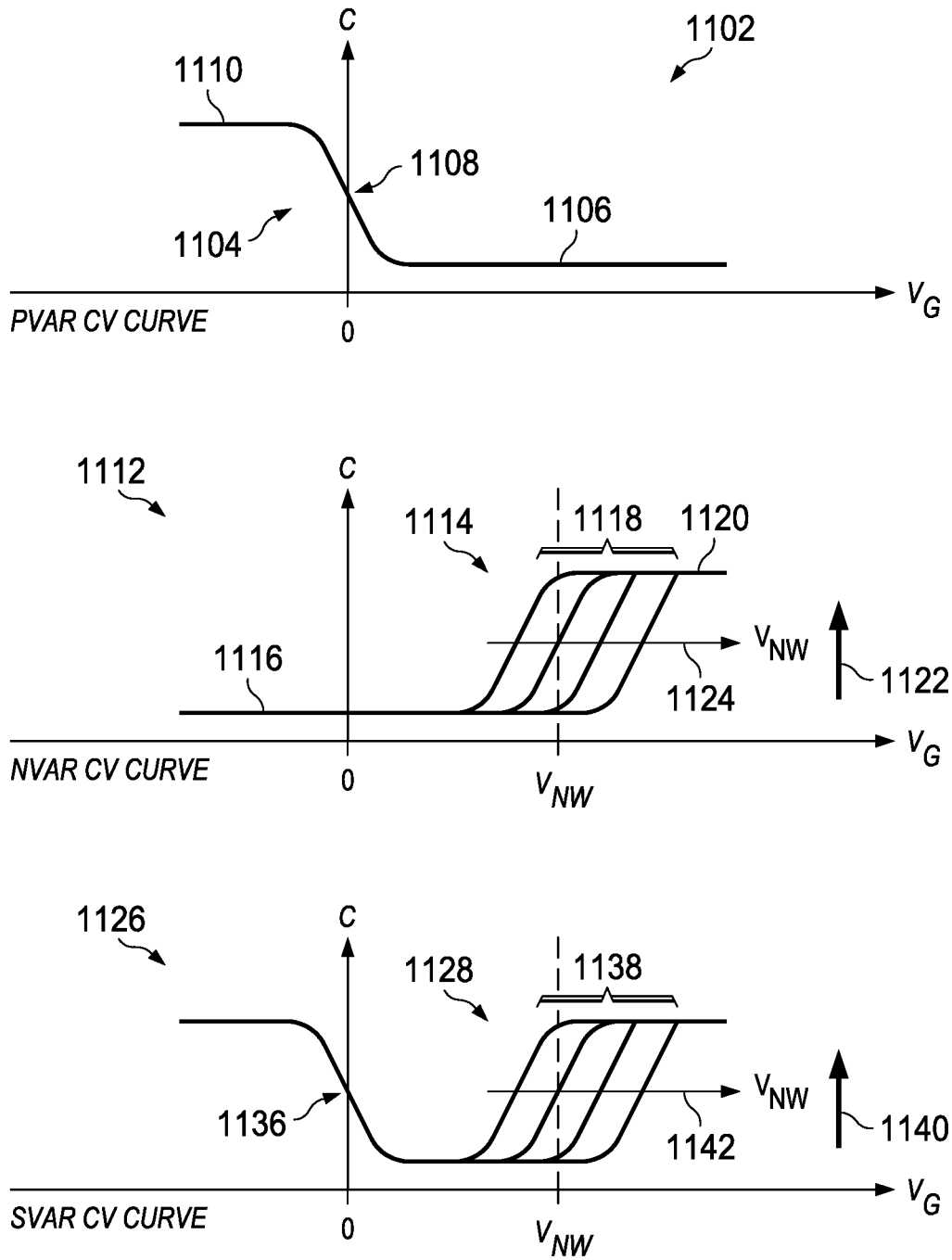
FIG. 11 is a diagram of the capacitance voltage curves and adaptive CV feature related to a symmetric varactor in accordance with the disclosure.

FIG. 11 is a diagram of the capacitance voltage curves related to a symmetric varactor in accordance with the disclosure. Diagram 1102 shows capacitance-voltage curve (CV curve) 1104 for a first varactor, such as first p-type varactor 904 of FIG. 9, which is shown as a p-type varactor. CV curve 1104 is "S" shaped or sigmoidal and is the reverse of CV curve 304 from FIG. 3. As voltage $V_G$ increases, capacitance C decreases from maximum value 1110 through linear portion 1108 to minimum value 1106. The location of linear portion 1108 is fixed and independent of voltage $V_G$, which is the top plate bias for the symmetric varactor.

Diagram 1112 shows CV curve 1114 for a second varactor of a symmetric varactor, such as second n-type varactor 906 of symmetric varactor 902 of FIG. 9. CV curve 1114 is also sigmoidally shaped with capacitance C increasing from minimum value 1116 through adjustable linear portion 1118 to maximum value 1120. The location of adjustable linear portion 1118 varies based on second voltage $V_{NW}$ that is applied to the second varactor. Second voltage $V_{NW}$ is distinct from voltage $V_G$. In a preferred embodiment, as $V_{NW}$ increases (shown by arrow 1122), adjustable linear portion 1118 moves to the right (shown by arrow 1124).

Diagram 1126 shows CV curve 1128 for a symmetric varactor that is a combination of CV curves 1104 and 1114 and includes linear portion 1136 and adjustable linear portion 1138. Linear portion 1136 does not move or shift in response to $V_{NW}$ while adjustable linear portion 1138 does move or shift in response to $V_{NW}$. In a preferred embodiment, as $V_{NW}$ increases (shown by arrow 1140), adjustable linear portion 1138 shifts to the right (shown by arrow 1142).

Figure 12:
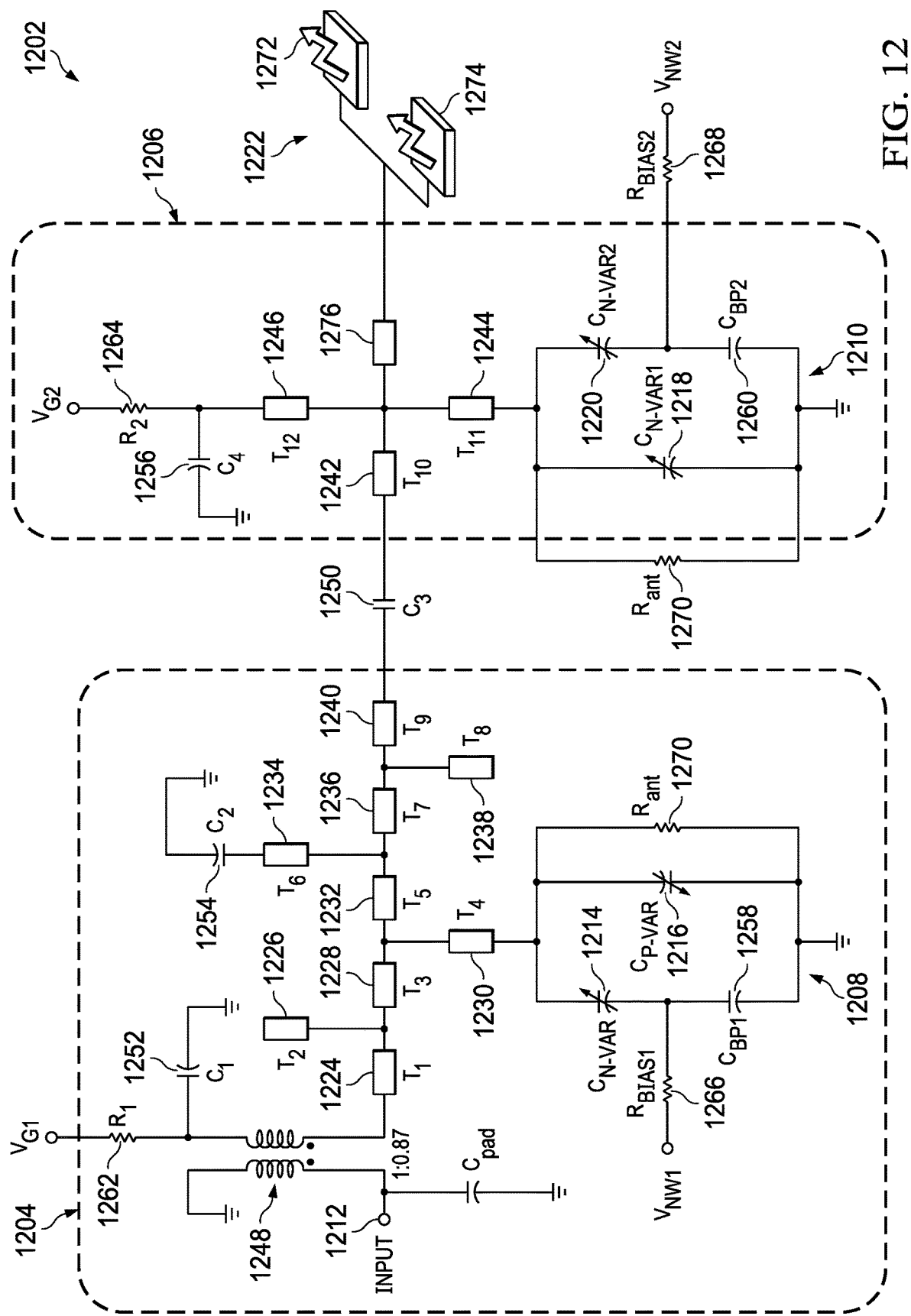
FIG. 12 is a schematic of a frequency multiplier in accordance with the disclosure.

FIG. 12 is a schematic of a frequency multiplier in accordance with the disclosure. Frequency multiplier 1202 includes first multiplier stage 1204 and second multiplier stage 1206. First multiplier stage 1204 includes symmetric varactor 1208 that acts as a five times frequency multiplier or frequency quintupler. Second multiplier stage 1206 includes asymmetric varactor 1210 that acts as a two times frequency multiplier or frequency doubler. When an input signal with a frequency of 140 GHz is applied to input terminal 1212, symmetric varactor 1208 outputs a signal with a frequency of 0.7 THz, which is five times the frequency of the input signal applied to terminal 1212. Asymmetric varactor 1210 outputs a signal with a frequency of 1.4 THz, which is two times the frequency of the signal from symmetric varactor 1208 and ten times the frequency of the original input signal. Symmetric varactor 1208 efficiently multiplies the input signal to just below the terahertz threshold and asymmetric varactor 1210 multiplies the frequency of the signal from symmetric varactor 1208 above the terahertz threshold.

N-type varactor 1214 (shown as $C_{N\text{-}VAR}$) of symmetric varactor 1208 and p-type varactor 1216 (shown as $C_{P\text{-}VAR}$) of symmetric varactor 1208 each include thirty three fingers. The use of thirty three fingers optimizes symmetric varactor 1208 to act as a quintupler for 18 dBm of input power ($P_{in}$) at 140 GHz. A simulated −3 dBm power is delivered to asymmetric varactor 1210 in second multiplier stage 1206 when symmetric varactor 1208 is biased to a first bias ratio of $V_{G1}/V_{NW1}$=2.75 V/5.5 V and asymmetric varactor 1210 is biased to a second bias ratio of $V_{G2}/V_{NW2}$=−0.3 V/0 V. At this power level and with these bias ratios and points, asymmetric varactor 1210 is optimal with 2 fingers each for n-type varactor 1218 (labeled as $C_{N\text{-}VAR1}$) and n-type varactor 1220 (labeled as $C_{N\text{-}VAR2}$), and delivers a simulated $P_{out}$ of −21 dBm at 1.4 THz to antenna array 1222.

Impedance matching and harmonic termination are carried out using 5 μm wide ground coplanar waveguide (GCPW) transmission lines (TLs) 1224 through 1246. The characteristic impedance for each transmission line 1224 through 1246 (also labeled as $T_1$ through $T_{12}$) is 48Ω and the loss is 1.5 dB/mm at 0.4 THz. Transmission lines 1224 through 1240 (also labeled as lines $T_1$ through $T_9$) in first multiplier stage 1204 and 1:0.87 turn-ratio transformer 1248 of first multiplier stage 1204 serve as harmonic terminations and 50Ω input match for first multiplier stage 1204.

Transmission lines 1242 through 1246 (also labeled as $T_{10}$ through $T_{12}$) in second multiplier stage 1206 and coupling capacitor 1250 along with the on-chip antenna array 1222 serve as harmonic terminations and output match for second multiplier stage 1206. The 20 femtofarad (fF) custom finger capacitor 1250 (also labeled as $C_3$) helps isolate the top plate DC-bias ($V_{G1}$) of symmetric varactor 1208 from the top plate DC-bias ($V_{G2}$) of asymmetric varactor 1210 between first multiplier stage 1204 and second multiplier stage 1206. Capacitor 1250 also acts as a high-pass filter to minimize feed-through of the input signal at the original frequency $f_0$ and unwanted harmonics of the original frequency below 0.7 THz.

All the bypass capacitors 1252, 1254, 1256, 1258, and 1260 (also labeled respectively as $C_1$, $C_2$, $C_4$, $C_{BP1}$, and $C_{BP2}$) include values of 1.5-3 picofarads (pF) and are custom metal oxide metal (MOM) type capacitors with simulated self-resonant frequencies of approximately 0.7 THz. The bias resistors 1262, 1264, 1266, and 1268 (also respectively labeled as $R_1$, $R_2$, $R_{BIAS1}$, and $R_{BIAS2}$) are 10 kΩ and are formed using the high-resistivity polysilicon layer.

To provide protection against plasma damage (also known as the antenna effect or plasma induced gate oxide damage) during processing, shunt resistors 1270 (also labeled as RANT) with resistance values of 19 kΩ are placed across symmetric varactor 1208 and across asymmetric varactor 1210. This increases loss by approximately 2 dB at 1.4 THz in simulations.

The output load of frequency multiplier 1202 is antenna array 1222 that includes two on-chip patch antennas 1272 and 1274 to radiate the THz signals provided by frequency multiplier 1202. Patch antennas 1272 and 1274 provide a 3 dB gain boost and help radiate a stronger signal at THz frequencies. Each patch element is 45 μm×72 μm in size. The 214 μm spacing between patch antennas 1272 and 1274 improves spatial combining and grating lobe suppression. A side ground shield is also included to suppress unwanted coupling to nearby circuits. Antenna array 1222 achieves a simulated peak gain of 9.7 dBi and 200 GHz impedance bandwidth ($|S_{11}|$<−5 dB). The 3 μm wide element feed line 1276 and the notch dimensions in patch antennas 1272 and 1274 are co-optimized with first and second multiplier stages 1204 and 1206 for optimum signal extraction from second multiplier stage 1206 at 1.4 THz.

FIG. 13 is a combination view of an asymmetric varactor with multiple fingers. Asymmetric varactor 1302 is one embodiment of asymmetric varactor 102 of FIG. 1, asymmetric varactor 810 of FIG. 8, and/or asymmetric varactor 1210 of FIG. 12. Asymmetric varactor 1302 includes first varactor 1304 and second varactor 1306.

First varactor 1304 is an n-type varactor that includes two fingers 1308. Each finger 1308 of first varactor 1304 includes a first layer 1314 that acts as a metal layer, a second layer 1316 that acts as an oxide layer, and a third layer 1318 that acts as a semiconductor layer to form a metal oxide semiconductor device.

Second varactor 1306 is an n-type varactor that includes two fingers 1310. Each finger 1310 of second varactor 1306 similarly includes a first layer 1320 that acts as a metal layer, a second layer 1322 that acts as an oxide layer, and a third layer 1324 that acts as a semiconductor layer to form a metal oxide semiconductor device.

First layer 1314 of each finger of first varactor 1304 are commonly connected to first layer 1320 of each finger of second varactor 1306 so as to form a single "top plate" for asymmetric varactor 1302 that can be biased via $V_G$.

Third layer 1318 of each finger of first varactor 1304 are commonly connected to a potential (which in a preferred embodiment is ground), but are not connected to third layer 1324 of second varactor 1306. Third layer 1324 of each finger of second varactor 1306 are commonly connected so as to be biased by $V_W$ applied to terminal 1312, but are not connected to third layer 1318 of first varactor 1304.

Varactors 1304 and 1306 are of the same polarity and doping type. First varactor 1304 includes substrate tap 1326 to ground substrate 1328.

FIG. 14 is a combination view of a symmetric varactor with multiple fingers. Symmetric varactor 1402 is one embodiment of symmetric varactor 806 of FIG. 8, symmetric varactor 902 of FIG. 9, and/or symmetric varactor 1208 of FIG. 12. Symmetric varactor 1402 includes first varactor 1404 and second varactor 1406.

First varactor 1404 is a p-type varactor that includes thirty three fingers 1408. Each finger 1408 of first varactor 1404 includes a first layer 1414 that acts as a metal layer, a second layer 1416 that acts as an oxide layer, and a third layer 1418 that acts as a semiconductor layer to form a metal oxide semiconductor device.

Second varactor 1406 is an n-type varactor that includes thirty-three fingers 1410. Each finger 1410 of second varactor 1406 includes a first layer 1420 that acts as a metal layer, a second layer 1422 that acts as an oxide layer, and a third layer 1424 that acts as a semiconductor layer to form a metal oxide semiconductor device.

First layers 1414 of each finger of first varactor 1404 are commonly connected to first layers 1420 of each finger of second varactor 1406 so as to form a single "top plate" for symmetric varactor 1402 that can be biased via $V_G$.

Third layer 1418 of each finger of first varactor 1404 are commonly connected to a potential (which in a preferred embodiment is ground), but are not connected to third layer 1424 of second varactor 1406. Third layer 1424 of each finger of second varactor 1406 are commonly connected so as to be biased by $V_W$ applied to terminal 1412, but are not connected to third layer 1418 of first varactor 1404.

Varactors 1404 and 1406 are of the opposite polarity and doping type. First varactor 1404 does not have a substrate tap because its doping type (p-type) is the same doping type as that of substrate 1428.

Figure 15:
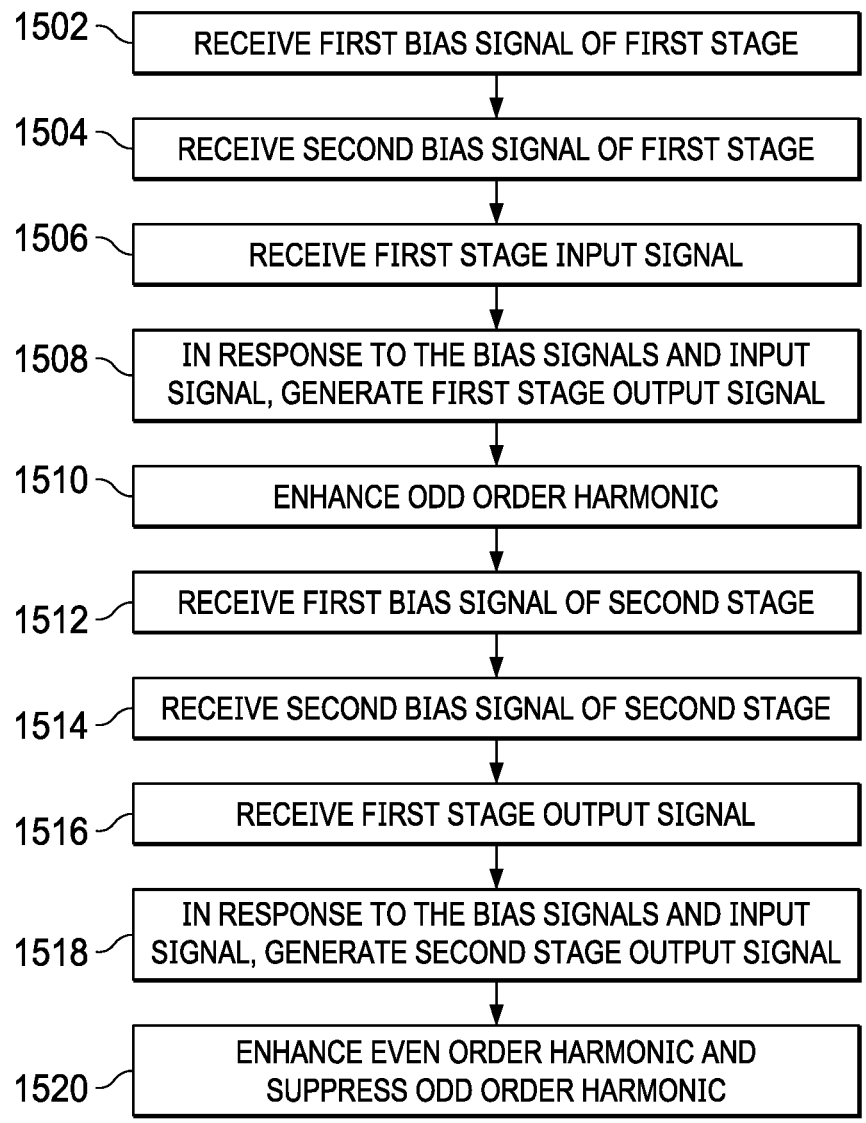
FIG. 15 is a flow chart of a method for a frequency multiplier in accordance with the disclosure.

FIG. 15 is a flow chart of a method for use of a frequency multiplier in accordance with the disclosure. A frequency multiplier, such as frequency multiplier 1202 of FIG. 12, includes two stages. The first stage is an odd harmonic quintupler comprising a symmetric varactor, such as symmetric varactor 902 of FIG. 9. The second stage is an even harmonic doubler comprising an asymmetric varactor, such as asymmetric varactor 102 of FIG. 1. The stages are connected generally as discussed in relation to FIG. 12.

At step 1502, a first bias signal, such as bias voltage $V_G$ of FIG. 9, of the first stage of the frequency multiplier is received. The first bias signal controls the top plate voltage of the symmetric varactor of the first stage of the multiplier.

At step 1504, a second bias signal, such as bias voltage $V_{NW}$ of FIG. 9, of the first stage of the frequency multiplier is received. The second bias signal controls the bias of a portion of the symmetric varactor of the second stage to control the location of the linear portion of the CV curve of the symmetric varactor.

At step 1506, a first stage input signal is received by the symmetric varactor of the first stage. The first stage input signal comprises a frequency that is to be multiplied by the multiplier and, in a preferred embodiment, quintupled by the symmetric varactor of the first stage.

At step 1508, in response to the first bias signal, the second bias signal, and the input signal of the first stage, the symmetric varactor generates an output signal of the first stage that is the input signal to the second stage of the multiplier. The first stage output signal includes a frequency that is an odd order harmonic of the frequency of the first stage input signal. The disclosed structure can be used for all frequency ranges as desired with selected components. In preferred embodiment, the output frequency range of the first stage output signal is one of: above about 0.3 THz, up to about 10 THz, below about 0.3 THz, less than about 1 THz, and less than about 5 THz.

At step 1510, an odd order harmonic is enhanced via the symmetric varactor due to the symmetric CV curve. In one preferred embodiment, the fifth order harmonic is enhanced. In alternative embodiments, other odd order harmonics are enhanced, such as the third order harmonic, the seventh order harmonic, and so on.

At step 1512, the second stage of the multiplier receives a first bias signal, such as bias voltage $V_G$ of FIG. 1. The first bias signal controls the top plate voltage of the asymmetric varactor of the second stage of the multiplier.

At step 1514, the second stage of the multiplier receives a second bias signal, such as bias voltage $V_{NW}$ of FIG. 1. The second bias signal controls the bias of a portion of the asymmetric varactor of the second stage of the multiplier.

At step 1516, the second stage of the multiplier receives the first stage output signal from the first stage of the multiplier. The first stage output signal, also referred to as the second stage input signal, is based on the original input signal to the first stage and has a frequency that is a multiple of the original input signal of the first stage.

At step 1518, in response to the first bias signal of the second stage, the second bias signal of the second stage, and the output signal from the first stage, the asymmetric varactor of the second stage generates a second stage output signal. The second stage output signal is above 1 THz and includes a frequency that is an even order harmonic of the first stage output signal. The disclosed structure can be used for all frequency ranges as desired with selected components. In preferred embodiment, the output frequency range of the second stage output signal is one of: above about 0.3

THz, up to about 10 THz, below about 0.3 THz, less than about 1 THz, and less than about 5 THz.

At step 1520, the second stage of the multiplier enhances even order harmonics and suppresses odd order harmonics. The first and second bias signals are selected so that the second order harmonic is enhanced for the available power from the first-stage, while the third and fifth order harmonics are suppressed in the second stage output signal. The second stage doubles the frequency from the first stage, which quintupled the original frequency, yielding an output signal from the multiplier having a frequency that is ten times the frequency of the original input signal to the multiplier.

The embodiments presented in this disclosure are intended to provide implementable examples of the present invention, but are not intended to limit the present invention. For example, other materials besides silicon can be used as a base semiconductor material. Various ranges of doping levels for the n-type and p-type regions can be employed as required. Various types and thickness of oxide materials can be employed. Any features, elements, or benefits of any one embodiment may be combined with the features elements and benefits of other embodiments.

The invention claimed is:

1. A frequency multiplier comprising:
an asymmetric varactor;
the asymmetric varactor comprising:
a first varactor of the asymmetric varactor, and
a second varactor of the asymmetric varactor;
the first varactor of the asymmetric varactor comprising:
a first layer, and
a third layer;
the second varactor of the asymmetric varactor comprising:
a first layer, and,
a third layer;
the first layer of the first varactor of the asymmetric varactor electrically connected to the first layer of the second varactor of the asymmetric varactor and to a first bias signal;
the third layer of the first varactor of the asymmetric varactor connected to a potential;
the third layer of the second varactor of the asymmetric varactor connected to a second bias signal;
in response to the first bias signal, the second bias signal, and an input signal, the asymmetric varactor:
exhibits an adaptive capacitance-voltage characteristic curve comprising a first portion with increasing capacitance that is not responsive to a change in a level of the second bias signal and a second portion that shifts in response to the change in the level of the second bias signal; and,
generates an output signal comprising an output frequency that is an even order multiple of an input frequency of the input signal.

2. The frequency multiplier of claim 1:
wherein the potential is ground; and,
wherein the output frequency is greater than about 0.3 terahertz.

3. The frequency multiplier of claim 1, further comprising:
in response to the first bias signal, the second bias signal, and the input signal, the asymmetric varactor:
enhances one or more even order harmonic of the input frequency.

4. The frequency multiplier of claim 1, further comprising:
in response to the first bias signal, the second bias signal, and the input signal, the asymmetric varactor:
suppresses one or more odd-order harmonics of the input frequency.

5. The frequency multiplier of claim 1,
wherein the first varactor of the asymmetric varactor and the second varactor of the asymmetric varactor are metal oxide semiconductor (MOS) devices and are of a same doping type.

6. The frequency multiplier of claim 5,
wherein the first varactor of the asymmetric varactor is an n-type varactor and the second varactor of the asymmetric varactor is an n-type varactor.

7. The frequency multiplier of claim 1,
wherein the first bias signal is a first bias signal of a second stage,
the second bias signal is a second bias signal of the second stage,
the input signal is a first stage output signal,
the output signal is a second stage output signal, and
the frequency multiplier further comprises:
a first stage;
the second stage;
the first stage comprising a symmetric varactor;
the second stage comprising the asymmetric varactor;
the symmetric varactor comprising:
a first varactor of the symmetric varactor, and
a second varactor of the symmetric varactor;
the first varactor of the symmetric varactor comprising:
a first layer, and
a third layer;
the second varactor of the symmetric varactor comprising:
a first layer, and
a third layer;
the first layer of the first varactor of the symmetric varactor electrically connected to the first layer of the second varactor of the symmetric varactor and to a first bias signal of the first stage;
the third layer of the first varactor of the symmetric varactor connected to a potential;
the third layer of the second varactor of the symmetric varactor connected to a second bias signal of the first stage; and,
in response to the first bias signal of the first stage, the second bias signal of the first stage, and a first stage input signal, the symmetric varactor generates the first stage output signal comprising a first stage output frequency that is an odd order multiple of a first stage input frequency of the first stage input signal.

8. The frequency multiplier of claim 7:
wherein the potential is ground;
wherein the first stage output frequency is less than about 5 terahertz; and,
wherein a second stage output frequency of the second stage output signal is up to about 10 terahertz.

9. The frequency multiplier of claim 7, further comprising:
in response to the first bias signal of the first stage, the second bias signal of the first stage, and the first stage input signal, the symmetric varactor:
enhances one or more odd order harmonics of the first stage input signal; and,
in response to the first bias of the second stage signal, the second bias signal of the second stage, and the first stage output signal, the asymmetric varactor:

enhances one or more even order harmonics of the first stage output signal, and
suppresses one or more odd order harmonics of the first stage output signal.

10. The frequency multiplier of claim 7, further comprising:
wherein the first varactor of the symmetric varactor and the second varactor of the symmetric varactor are metal oxide semiconductor (MOS) devices and are of a different doping type; and,
wherein the first varactor of the asymmetric varactor and the second varactor of the asymmetric varactor are metal oxide semiconductor (MOS) devices and are of a same doping type.

11. The frequency multiplier of claim 7, further comprising:
wherein the first varactor of the symmetric varactor is a p-type varactor and the second varactor of the symmetric varactor is an n-type varactor; and,
wherein the first varactor of the asymmetric varactor is an n-type varactor and the second varactor of the asymmetric varactor is an n-type varactor.

12. The frequency multiplier of claim 1 wherein the adaptive capacitance-voltage characteristic curve comprises at least three inflection points in which the position of at least one of the three inflection points shifts in response to the change in level of the second bias signal.

13. A frequency multiplier comprising:
an asymmetric varactor;
the asymmetric varactor comprising:
a first varactor of the asymmetric varactor, and
a second varactor of the asymmetric varactor;
the first varactor of the asymmetric varactor comprising:
a first layer, and
a third layer;
the second varactor of the asymmetric varactor comprising:
a first layer, and,
a third layer;
the first layer of the first varactor of the asymmetric varactor electrically connected to the first layer of the second varactor of the asymmetric varactor and to a first bias signal;
the third layer of the first varactor of the asymmetric varactor connected to a potential;
the third layer of the second varactor of the asymmetric varactor connected to a second bias signal;
in response to the first bias signal, the second bias signal, and an input signal, the asymmetric varactor:
exhibits an adaptive capacitance-voltage characteristic curve comprising a first portion with increasing capacitance that is not responsive to a change in the level of the second bias signal and a second portion that shifts in response to the change in level of the second bias signal; and,
generates an output signal comprising an output frequency that is an even order multiple of an input frequency of the input signal;
wherein the third layer of the first varactor and the third layer of the second varactor are of a first doping type; and,
wherein the first bias signal is connected to a well of a second bias type in the third layer.

* * * * *